United States Patent
Onishi et al.

(10) Patent No.: US 6,576,935 B2
(45) Date of Patent: Jun. 10, 2003

(54) BIDIRECTIONAL SEMICONDUCTOR DEVICE AND METHOD OF MANUFACTURING THE SAME

(75) Inventors: Yasuhiko Onishi, Nagano (JP); Tatsuhiko Fujihira, Nagano (JP); Susumu Iwamoto, Nagano (JP); Takahiro Sato, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/894,989

(22) Filed: Jun. 28, 2001

(65) Prior Publication Data

US 2002/0060330 A1 May 23, 2002

(30) Foreign Application Priority Data

Jul. 12, 2000 (JP) .......................................... 2000-211858

(51) Int. Cl.[7] .......................... H01L 29/74; H01L 31/111
(52) U.S. Cl. .................. 257/124; 257/401; 257/409; 257/129; 257/341; 257/495
(58) Field of Search ................................ 257/119, 110, 257/120, 121, 122, 123, 124–141, 162, 165, 343, 423, 556, 557, 575, 262, 273, 278, 338, 341, 373, 374, 377, 378

(56) References Cited

U.S. PATENT DOCUMENTS

| | | | | |
|---|---|---|---|---|
| 4,003,072 A | * | 1/1977 | Matsushita et al. | 357/52 |
| 4,754,310 A | | 6/1988 | Coe | 357/13 |
| 5,040,042 A | * | 8/1991 | Bauer et al. | 357/38 |
| 5,105,253 A | * | 4/1992 | Polllock | 357/49 |
| 5,216,275 A | | 6/1993 | Chen | 257/493 |
| 5,438,215 A | | 8/1995 | Tihanyi | 257/401 |
| 5,608,237 A | * | 3/1997 | Aizawa et al. | 257/132 |
| 6,081,009 A | * | 6/2000 | Neilson | 257/341 |
| 6,316,819 B1 | * | 11/2001 | Zivic | 257/595 |

FOREIGN PATENT DOCUMENTS

| | | | |
|---|---|---|---|
| JP | 403136374 A | * | 6/1991 |
| JP | 404030476 A | * | 2/1992 |

* cited by examiner

*Primary Examiner*—Wael Fahmy
*Assistant Examiner*—Dana Farahani
(74) *Attorney, Agent, or Firm*—Rossi & Associates

(57) ABSTRACT

A bidirectional semiconductor device facilitates making a current flow from the first MOSFET to the second MOSFET and vice versa across low on-resistance and exhibits a high breakdown voltage. The bidirectional semiconductor device includes a first n-channel MOSFET including base regions, a second n-channel MOSFET including base regions, and an alternating conductivity type layer formed of drift region and partition regions arranged alternately. Partition regions are isolated from base regions by a high resistivity region and from base regions by a high resistivity region to maintaining a high breakdown voltage between first MOSFET and the second MOSFET. By connecting high resistivity regions and via drift regions to each other, a current is made flow from the first MOSFET to the second MOSFET and vice versa and the on-voltage is reduced.

26 Claims, 27 Drawing Sheets

BIDIRECTIONAL SEMICONDUCTOR DEVICE AND METHOD OF MANUFACTURING THE SAME

FIELD OF THE INVENTION

The present invention relates to a semiconductor structure applicable to semiconductor devices, such as MOSFET's (insulated gate field effect transistors), IGBT's (insulated gate bipolar transistors) and bipolar transistors. More specifically, the present invention relates to a bidirectional super-junction semiconductor device that exhibits a high breakdown voltage and a high current capacity and facilitates making a current flow from the first device region to the second device region and vice versa and a method of manufacturing the bidirectional super-junction semiconductor device.

BACKGROUND OF THE INVENTION

The super-junction semiconductor device is a semiconductor device that includes a drift region including one or more alternating conductivity type layers. The alternating conductivity type layer provides a current path in the ON-state of the semiconductor device and is depleted in the OFF-state of the semiconductor device. The alternating conductivity type layer is formed of drift regions of a first conductivity type (e.g. an n-type) and partition regions of a second conductivity type (e.g. a p-type) arranged alternately.

FIG. 27 is a cross sectional view of a conventional vertical bidirectional MOS-type semiconductor device, disclosed in Japanese Unexamined Laid Open Patent Application H07-307469, that facilitates controlling a DC current and an AC current at a low on-voltage. Referring now to FIG. 27, the conventional bidirectional MOS-type semiconductor device includes a first n-channel IGBT and a second n-channel IGBT. The first n-channel IGBT is formed of $n^+$-type emitter layers 102, p-type base layers 103, an $n^-$-type substrate 101 and p-type anode layers 104. The second n-channel IGBT is formed of $n^+$-type emitter layers 105, p-type base layers 104, an $n^-$-type substrate 101 and p-type anode layers 103. The operation of the second n-channel IGBT is the inversion of the operation of the first n-channel IGBT. The first n-channel IGBT makes a current flow from a first terminal 106 to a second terminal 107. The second n-channel IGBT makes a current flow from second terminal 107 to first terminal 106.

In the conventional MOSFET's, low on-resistance causes a low breakdown voltage and a high breakdown voltage causes high on-resistance. That is, a tradeoff relation exists between the on-resistance and the breakdown voltage. The tradeoff relation between the on-resistance and the breakdown voltage exists also in IGBT'S, bipolar transistors and diodes. The tradeoff relation exists in the vertical devices, in that the flow direction of the drift current and the expansion direction of the depletion layers coincide with each other, and in the lateral devices, in that the flow direction of the drift current and the expansion direction of the depletion layers are different from each other.

Japanese Unexamined Laid Open Patent Application H10-209267 discloses a super-junction semiconductor device that reduces the tradeoff relation described above. The disclosed super-junction semiconductor device includes a heavily doped alternating conductivity type drift layer formed of n-type regions and p-type regions arranged alternately. The alternating conductivity type layer is depleted to sustain a high breakdown voltage in the OFF-state of the device. Since the depletion layers that expand from the pn-junctions between n-type regions and the p-type regions in the OFF-state of the device deplete the entire drift layer, a high breakdown voltage is obtained even when the alternating conductivity type drift layer is doped heavily.

However, the super-junction MOSFET's proposed so far are unidirectional devices, that are capable of controlling the current flowing from the drain to the source but incapable of controlling the current flowing from the source to the drain. In other words, any semiconductor structure, that facilitates reducing the tradeoff relation between the on-resistance and the breakdown voltage of the bidirectional semiconductor devices, has not been proposed so far. Although the super-junction semiconductor device structures proposed so far sustain the breakdown voltage when the drain is biased at a potential higher than the source potential, the super-junction semiconductor device structures proposed so far fail to sustain the breakdown voltage when the drain is biased at a potential lower than the source potential.

In view of the foregoing, it is an object of the invention to provide a bidirectional super-junction semiconductor device that exhibits a high breakdown voltage and facilitates making a current flow from the first device region to the second device region and vice versa across low on-resistance. It is another object of the invention to provide a method of manufacturing the bidirectional super-junction semiconductor device.

SUMMARY OF THE INVENTION

According to a first embodiment of the present invention, there is provided a bidirectional super-junction semiconductor device including: a semiconductor chip having a first major surface and a second major surface, the semiconductor chip including an alternating conductivity type layer between the first major surface and the second major surface; the alternating conductivity type layer being formed of drift regions of a first conductivity type and partition regions of a second conductivity type, the alternating conductivity type layer providing a current path in the ON-state of the semiconductor device, the alternating conductivity type layer being depleted in the OFF-state of the semiconductor device; a first device region on a first side of the alternating conductivity type layer; a second device region on a second side of the alternating conductivity type layer facing opposite to the first side; first regions of the second conductivity type in the first device region; second regions of the second conductivity type in the second device region; and a semiconductor region of the first conductivity type, the semiconductor region including at least the drift regions, the semiconductor region isolating the first regions and the second regions form each other, the semiconductor region isolating the partition regions from the first regions and the second regions.

Since the semiconductor region of the first conductivity type isolates the partition regions of the second conductivity type, the first regions of the second conductivity type in the first device region and the second regions of the second conductivity type in the second device region from each other, a high breakdown voltage is obtained in the opposite directions.

Advantageously, the semiconductor region of the first conductivity type includes a third region of the first conductivity type in the first device region and a fourth region of the first conductivity type in the second device region, and the third region and the fourth region are connected to each other via the drift regions. This configuration facilitates making a current flow from the first device region to the second device region and vice versa and reducing the on-resistance.

According to a second embodiment of the present invention, there is provided a bidirectional super-junction semiconductor device including: a semiconductor chip having a first major surface and a second major surface, the semiconductor chip including a first alternating conductivity type layer and a second alternating conductivity type layer between the first major surface and the second major surface; the first alternating conductivity type layer being formed of drift regions of a first conductivity type and partition regions of a second conductivity type, the first alternating conductivity type layer providing a current path in the ON-state of the semiconductor device, the first alternating conductivity type layer being depleted in the OFF-state of the semiconductor device; the second alternating conductivity type layer being formed of drift regions of the first conductivity type and partition regions of the second conductivity type, the second alternating conductivity type layer providing a current path in the ON-state of the semiconductor device, the second alternating conductivity type layer being depleted in the OFF-state of the semiconductor device; a first device region on a side of the first alternating conductivity type layer; a second device region on a side of the second alternating conductivity type layer; and a semiconductor region of the first conductivity type, the semiconductor region isolating the partition regions of the first alternating conductivity type layer and the partition regions of the second alternating conductivity type layer from each other.

The partition regions on the side of the first device region and the partition regions on the side of the second device region are isolated from each other by the semiconductor region of the first conductivity type. The first regions in the first device region and the second regions in the second device region are isolated from each other even when the partition regions in the first alternating conductivity type are connected to the first regions and the partition regions in the second alternating conductivity type are connected to the second regions. Therefore, a high breakdown voltage is obtained in the opposite directions between the first device region and the second device region.

In the configurations described above, the drift regions in the first alternating conductivity type layer and the drift regions in the second alternating conductivity type layer may be connected via the semiconductor region of the first conductivity type. Since a current path is formed by connecting the drift regions in the first alternating conductivity type layer and the drift regions in the second alternating conductivity type layer, a current is made flow from the first device region to the second device region and vice versa, and the on-resistance is reduced.

According to a third embodiment of the invention, there is provided a method of manufacturing a bidirectional super-junction semiconductor device formed of a first half device and a second half device; the first half device including a first device region and a first alternating conductivity type layer formed of drift regions of a first conductivity type and partition regions of a second conductivity type, the first alternating conductivity type layer providing a current path in the ON-state of the semiconductor device, the first alternating conductivity type layer being depleted in the OFF-state of the semiconductor device; the second half device including a second device region and a second alternating conductivity type layer formed of drift regions of the first conductivity type and partition regions of the second conductivity type, the second alternating conductivity type layer providing a current path in the ON-state of the semiconductor device, the second alternating conductivity type layer being depleted in the OFF-state of the semiconductor device, the method including the steps of: forming the first half device; forming the second half device; and bonding the back surface of the first half device, under that the first device region is not formed, and the back surface of the second half device, under that the second device region is not formed. Since the first alternating conductivity type layer and the second alternating conductivity type layer are formed easily by the manufacturing method described above, the manufacturing process is simplified and the manufacturing costs are reduced.

DETAILED DESCRIPTION OF THE INVENTION

Now the invention will be explained hereinafter with reference to the accompanied drawing figures which illustrate the preferred embodiments of the invention.

First Embodiment

Figure 1:
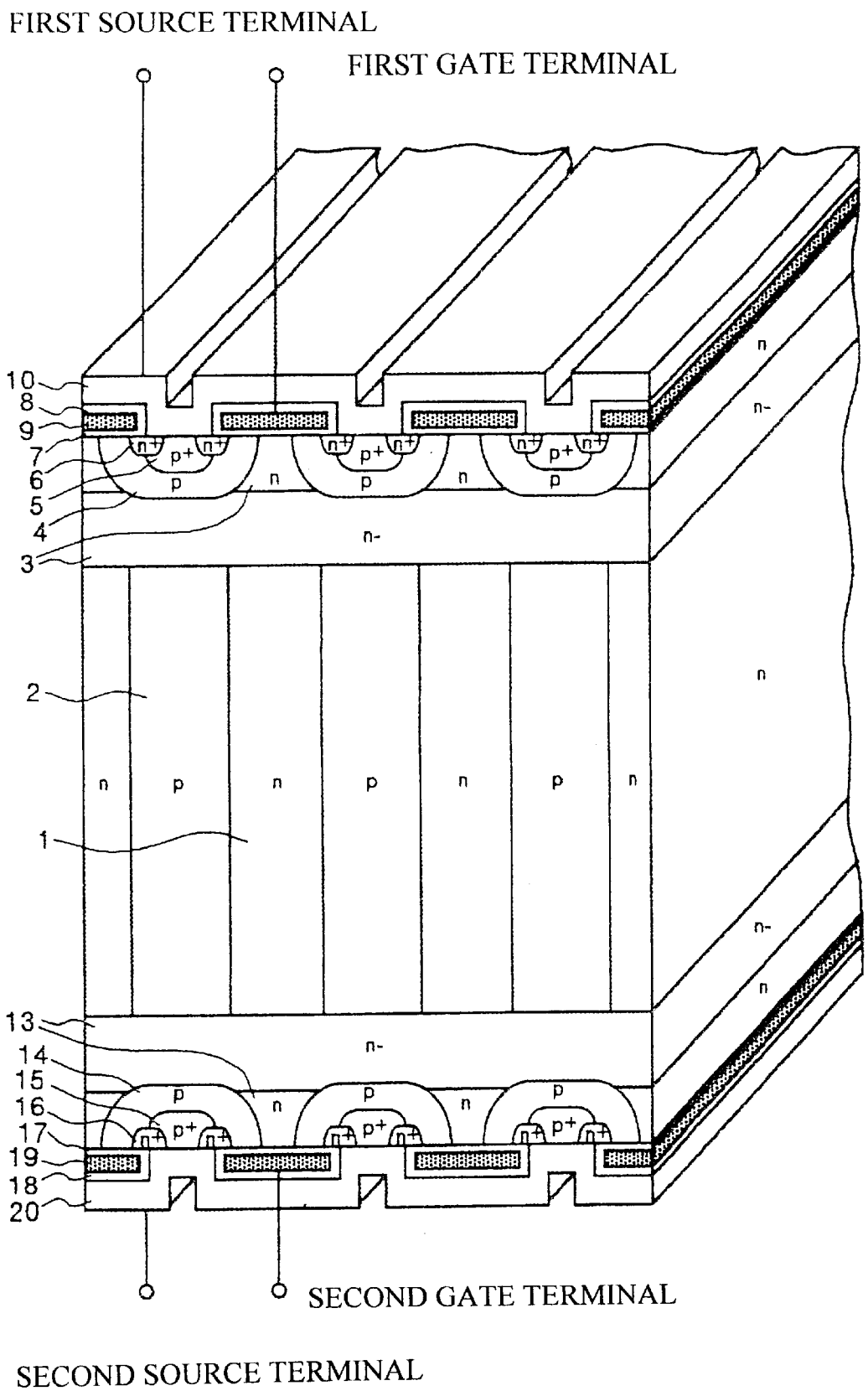
FIG. 1 is a perspective cross sectional view of a vertical bidirectional super-junction MOSFET according to a first embodiment of the invention.

FIG. 1 is a perspective cross sectional view of a vertical bidirectional super-junction MOSFET according to a first embodiment of the invention.

Referring now to FIG. 1, the vertical bidirectional super-junction MOSFET according to the first embodiment includes a semiconductor chip having a first major surface and a second major surface, a first device region on the side of the first major surface, a second device region on the side of the second major surface and a semiconductor region between the first device region and the second device region. The first device region includes a first n-channel MOSFET. The second device region includes a second n-channel MOSFET. The semiconductor region includes an alternating conductivity type layer.

The first n-channel MOSFET is formed of p-type base regions (first regions) 4, n$^+$-type source regions 6, gate insulation films 7, gate electrodes 9 and a source electrode 10. A heavily doped p$^+$-type contact region 5 and n$^+$-type source regions 6 are in p-type base region 4. Base region 4 isolates source region 6 from a high resistivity n-type region (third region) 3. Gate electrode 9 is above the extended portion of base region 4 extended between source region 6 and high resistivity n-type region 3 with a gate insulation film 7 interposed therebetween. Source electrode 10 is extended onto an interlayer insulation film 8 and contact regions 5. High resistivity region 3 includes regions doped relatively heavily and extending from the first major surface of the semiconductor chip to the depth near to the bottoms of base regions 4.

The second n-channel MOSFET has a structure same with that of the first n-channel MOSFET. The second n-channel MOSFET is formed of p-type base regions (second regions) 14, n$^+$-type source regions 16, gate insulation films 17, gate electrodes 19 and a source electrode 20. A heavily doped p$^+$-type contact region 15 and n$^+$-type source regions 16 are in p-type base region 14. Base region 14 isolates source region 16 from a high resistivity n-type region (fourth region) 13. Gate electrode 19 is above the extended portion of base region 14 extended between source region 16 and high resistivity n-type region 13 with a gate insulation film 17 interposed therebetween. Source electrode 20 is extended onto an interlayer insulation film 18 and contact regions 15. High resistivity region 13 includes regions doped relatively heavily and extending from the second major surface of the semiconductor chip to the depth near to the bottoms of base regions 14.

The alternating conductivity type layer is between two high resistivity regions 3 and 13. The alternating conductivity type layer is formed of n-type drift regions 1 and p-type partition regions 2 alternately arranged each other. Drift regions 1 are connected to high resistivity regions 3 and 13. High resistivity regions 3 and 13 isolate partition regions 2 from base regions 4 and 14 of the first and second MOSFET's. Due to the structure described above, the alternating conductivity type layer provides a current path in the ON-state of the device and is depleted in the OFF-state of the device.

It is necessary to adjust the impurity concentration and the thickness of high resistivity regions 3 and 13 at respective appropriate values, thereat the electric field strength on the pn-junctions between base regions 4 and high resistivity region 3 of the first device region is less than the critical value at the voltage necessary to deplete the alternating conductivity type layer completely and thereat the depletion layers expanding from the alternating conductivity type layer never punch through high resistivity region 13 to base regions 14 of the second device region. By adjusting the impurity concentration and the thickness of high resistivity regions 3 and 13 at respective appropriate values, a high breakdown voltage is obtained easily. Since the drift current flows through the heavily doped regions of the alternating conductivity type layer in the ON-state of the device, the on-resistance is reduced.

The impurity amounts in drift region 1 and partition region 2 are preferably the same. The planar arrangement pattern of drift regions 1, partition regions 2 or drift regions 1 and partition regions 2 is not always limited to a stripe pattern. Drift regions 1 or partition regions 2 may be located at the lattice points of a trigonal lattice, an orthogonal lattice or a hexagonal lattice. When the impurity amounts in drift region 1 and partition region 2 are the same, a high breakdown voltage is obtained easily independently of the planar arrangement pattern thereof When the impurity amounts in drift region 1 and partition region 2 are not the same, it is difficult to obtain a high breakdown voltage, since some portions may remain undepleted in the alternating conductivity type layer.

The dimensions and the impurity concentrations of the constituent regions in the bidirectional super-junction MOSFET of the 500 V class having the structure described above are as follows. The drift region is 30.0 □m in thickness. The widths of n-type drift region 1 and p-type partition region 2 are 8.0 □m. The impurity concentrations in n-type drift region 1 and p-type partition region 2 are $2.0 \times 10^{15}$ cm$^{-3}$. The diffusion depths of base regions 4 and 14 are 3.5 □m. The surface impurity concentrations of base regions 4 and 14 are $2.0 \times 10^{17}$ cm$^{-3}$. The diffusion depths of contact regions 5 and 15 are 1.0 □m. The surface impurity concentrations of contact regions 5 and 15 are $4.0 \times 10^{19}$ cm$^{-3}$. The diffusion depths of source regions 6 and 16 are 0.5 □m. The surface impurity concentrations of source regions 6 and 16 are $3.0 \times 10^{20}$ cm$^{-3}$. High resistivity regions 3 and 13 are 19.0 □m in thickness. The impurity concentrations in high resistivity regions 3 and 13 are $3.0 \times 10^{14}$ cm$^{-3}$. The surface impurity concentration in the relatively heavily doped portion from the surface to the diffusion depth of 3.0 □m of high resistivity region 3 or 13 is relatively high $1.0 \times 10^{16}$ cm$^{-3}$.

FIGS. 2 through 6 are perspective cross sectional views for explaining the steps for manufacturing the bidirectional super-junction MOSFET according to the first embodiment.

Figure 2:
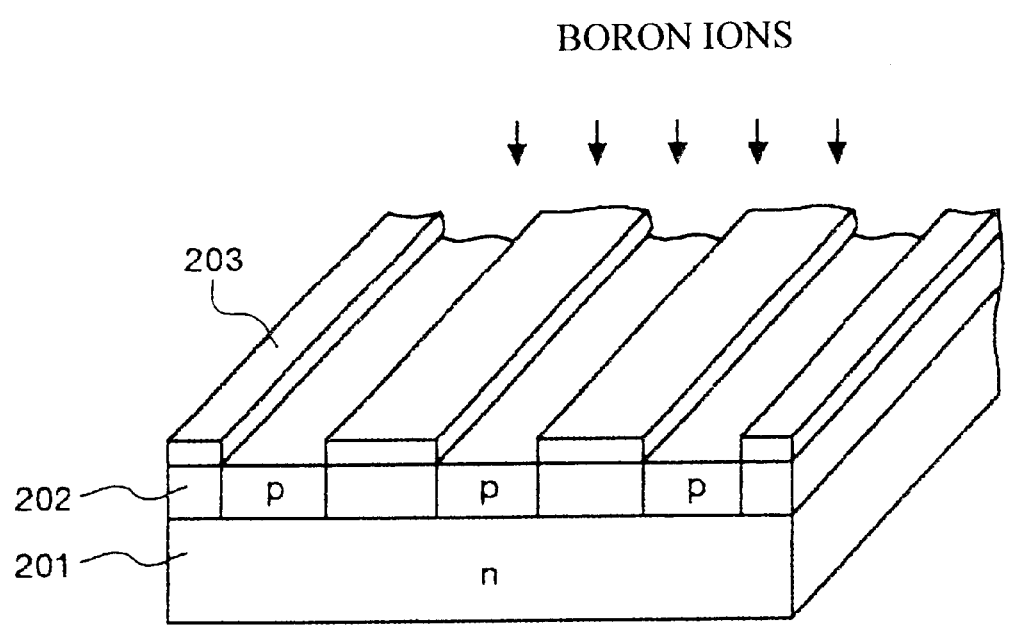
FIGS. 2 through 6 are perspective cross sectional views for explaining the steps for manufacturing the bidirectional super-junction MOSFET according to the first embodiment.

Referring now to FIG. 2, an n-type high resistivity layer 202 is grown epitaxially on an n-type substrate 201. A photoresist mask 203 is formed on n-type high resistivity layer 202. Boron ions are implanted into the portions of high resistivity layer 202, therein partition regions 2 will be formed.

Figure 3:
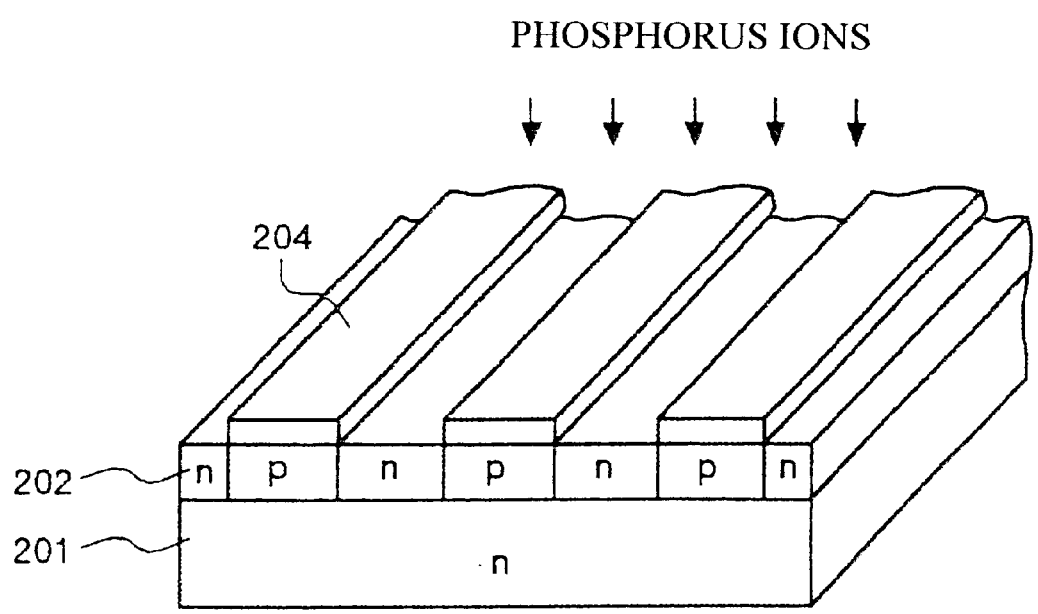

Referring now to FIG. 3, photoresist mask 203 is removed. A photoresist mask 204 is formed on n-type high resistivity layer 202. Phosphorus ions are implanted into the other portions of high resistivity layer 202, therein drift regions 1 will be formed.

Figure 4:
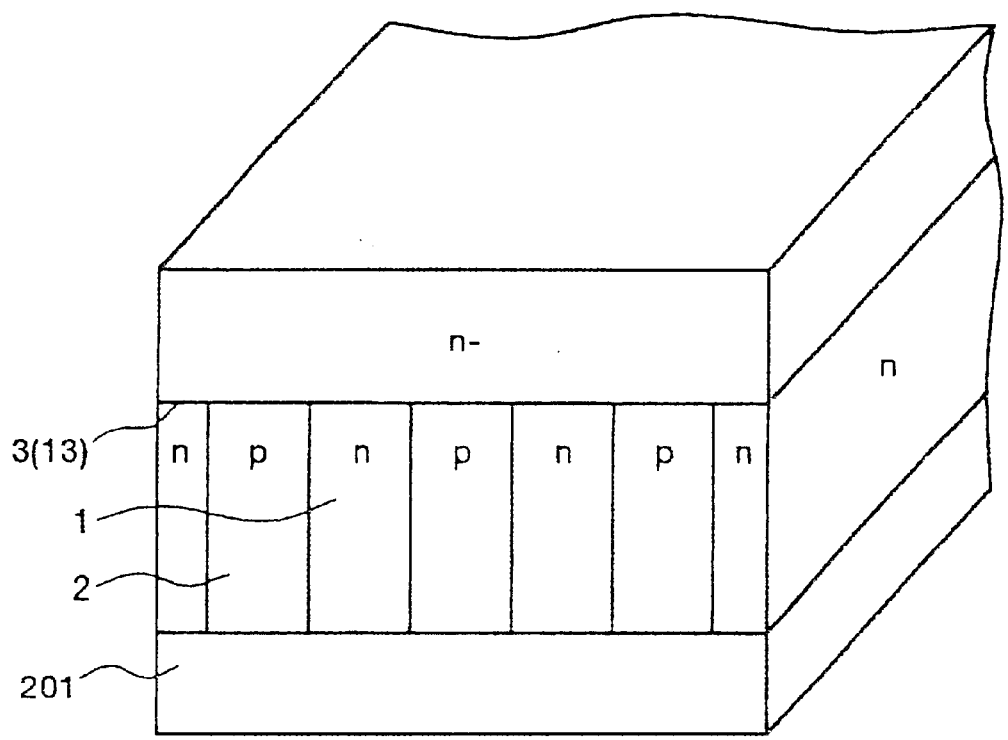

Referring now to FIG. 4, photoresist mask 204 is removed. The step sequence of the epitaxial growth, the boron ion implantation and the phosphorus ion implantation is repeated until an epitaxial laminate of a predetermined thickness is obtained. Then, high resistivity region 3 is grown epitaxially on the epitaxial laminate. Drift regions 1 and partition regions 2 are formed by thermally treating the epitaxial laminate with high resistivity region 3 formed thereon to drive and activate the implanted impurity ions.

Figure 5:
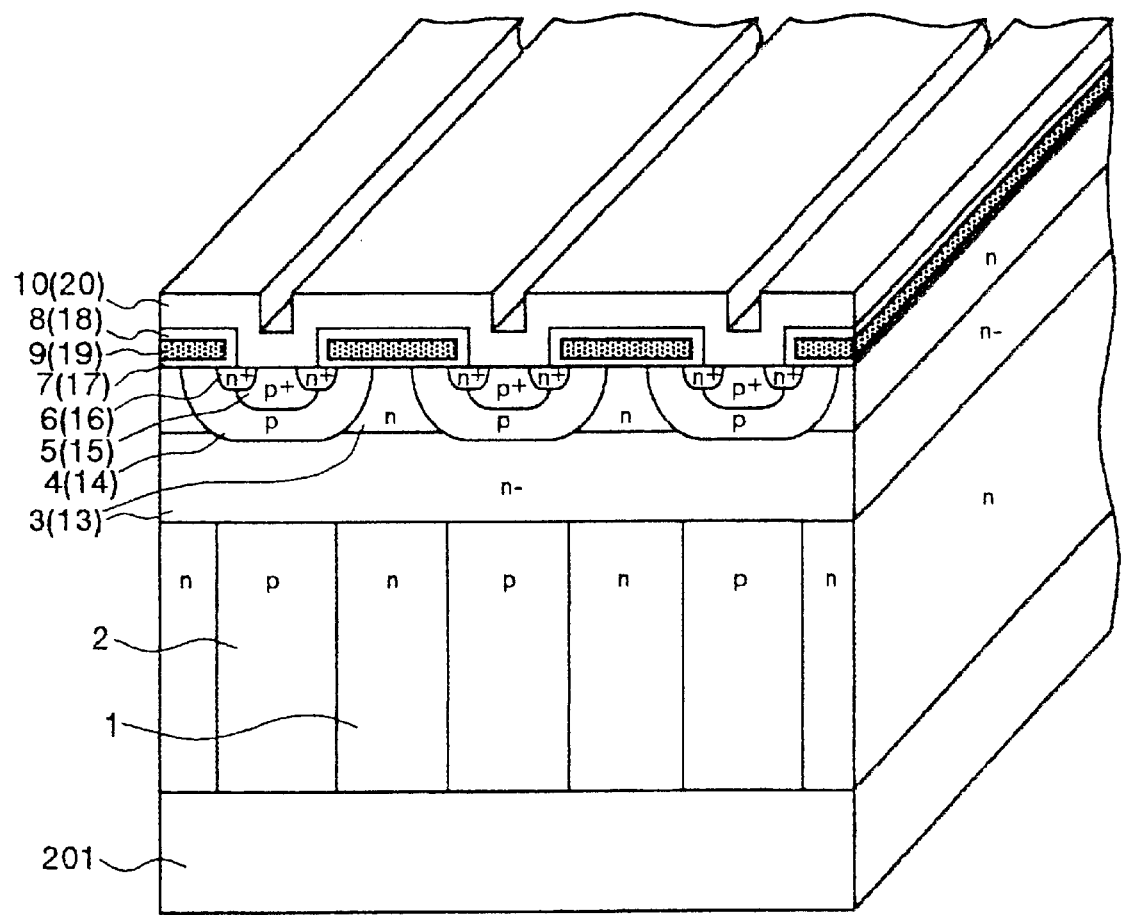

Referring now to FIG. 5, base regions 4, contact regions 5 and source regions 6 are formed in the surface portion of high resistivity region 3 through the conventional steps for manufacturing a double-diffused MOSFET. Then, gate oxide films (gate insulation films) 7 and polycrystalline silicon gate electrodes 9 are formed. Interlayer insulation film 8 is deposited on gate electrodes 9. Contact holes are bored through interlayer insulation film 8. Source electrode 10 is formed by sputtering a metal silicide such as Al—Si.

Figure 6:
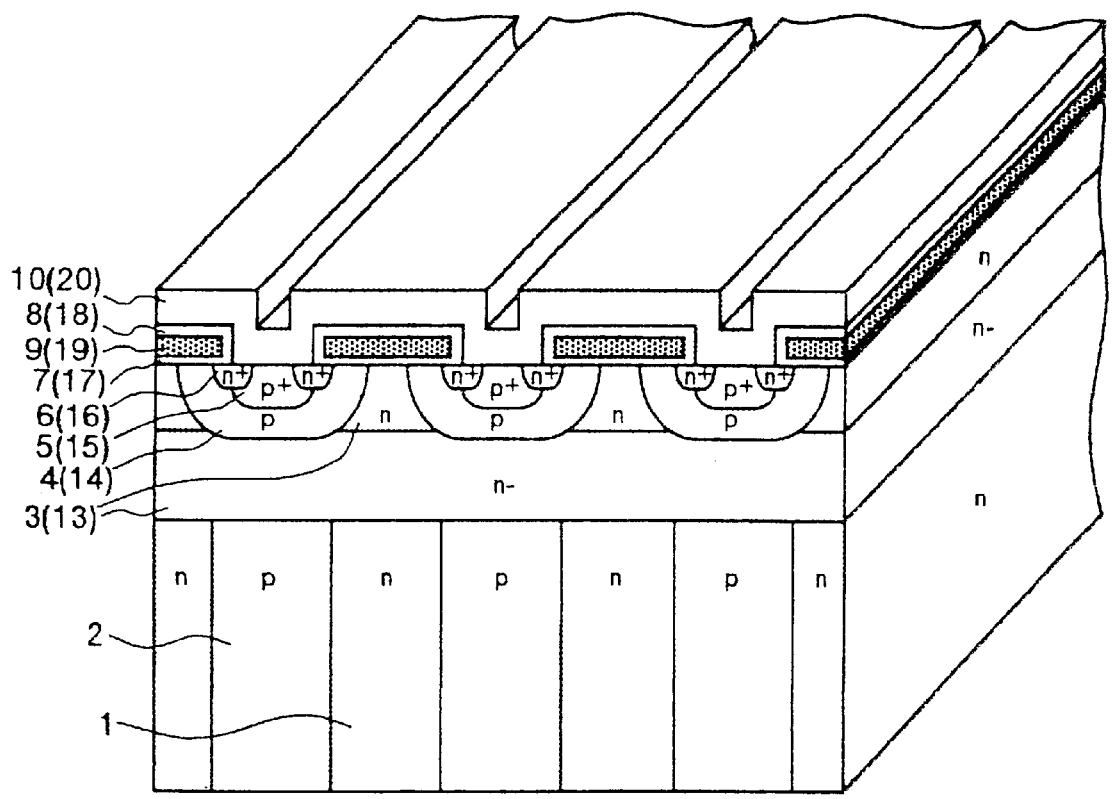

Referring now to FIG. 6, the semiconductor chip including substrate 201 and the alternating conductivity type layer is polished mechanically and chemically from the back surface of substrate 201 until the thickness of the semiconductor chip including the alternating conductivity type layer is a predetermined value. The back surface of the half device thus obtained and the back surface of another half device obtained in the same way as described above are directly bonded with each other. The semiconductor device as shown in FIG. 1 is formed by thermally treating the bonded half devices at around 400□ under an applied pressure. Before bonding, natural oxide films on the bonding planes are removed as much as possible with aqueous HF solution.

Now the operations of the bidirectional super-junction MOSFET according to the first embodiment will be described.

First, a first OFF-state operation will be explained. The gate terminal of the first MOSFET (hereinafter referred to as the "first gate terminal) and the source terminal of the first MOSFET (hereinafter referred to as the "first source terminal) are electrically connected to each other and the gate terminal of the second MOSFET (hereinafter referred to as the "second gate terminal) and the source terminal of the second MOSFET (hereinafter referred to as the "second source terminal) are electrically connected to each other. In this state, a positive voltage higher than the first source potential is applied to the second source terminal and the second gate terminal. As the applied positive voltage is boosted, depletion layers expand from the pn-junctions between base regions 4 and high resistivity region 3 on the side of the first MOSFET into high resistivity region 3 and reach the alternating conductivity type layer.

As the depletion layers reach the alternating conductivity type layer, base regions 4 on the side of the first MOSFET and partition regions 2 are electrically connected to each other. Since base regions 4 and partition regions 2 are electrically connected to each other, the depletion layers expand also into high resistivity region 13 on the side of the second MOSFET and in perpendicular to the pn-junction planes in the alternating conductivity type layer. The voltage applied to the second source terminal and the second gate terminal is further boosted, the alternating conductivity type layer is depleted completely and the depletion layers further expand toward base regions 14 through high resistivity region 13 on the side of the second MOSFET. A high breakdown voltage is maintained until vigorous avalanche amplification of the holes injected from base regions 14 occurs in the depleted regions expanding in front. When a negative voltage lower than the first source potential is applied to the second source terminal and the second gate terminal connected electrically with each other, the operation of the bidirectional super-junction MOSFET of FIG. 1 is the inversion of the operation described above.

Now a second OFF-state operation will be explained. The first gate terminal is connected electrically to the first source terminal and positive voltages higher than the first source potential are applied to the second source terminal and the second gate terminal. The difference of the voltages applied to the second gate terminal and the second source terminal is maintained at a value, thereat n-channels are formed. Depletion layers expand in the same manner as in the foregoing first OFF-state operation, therein any n-channel is not formed. However, the second OFF-state operation facilitates obtaining a breakdown voltage higher than that obtained by the first OFF-state operation, since holes are hardly injected from base regions 14 on the side of the second MOSFET and since the second source terminal, high resistivity region 13 on the side of the second MOSFET and drift regions 1 are electrically connected to each other.

If one considers that the structure formed of base regions 4, high resistivity regions 3 and 13, drift regions 1 and base regions 14 is a pnp-bipolar transistor, the breakdown voltage in the state, therein any channel is not formed, will correspond to the breakdown voltage BVceo between the collector and the emitter with the base opened. The breakdown voltage in the state, therein channels are formed, will correspond to the breakdown voltage BVcbo between the collector and the base with the emitter opened. When negative voltages lower than the first source potential are applied to the second source terminal and the second gate terminal, the operation of the bidirectional super-junction MOSFET is the inversion of the operation described above.

The bidirectional super-junction MOSFET is switched from the OFF-state to the ON-state by applying a positive voltage higher than the first source potential to the first gate terminal and a positive voltage higher than the second source potential to the second gate terminal. When the positive voltages applied to the second source terminal and the second gate terminal are high enough to form n-channels in the surface portions of base regions 4 and 14, electrons flow from the first source terminal to the second source terminal via the n-channels in base regions 4, high resistivity region 3, drift regions 1, high resistivity region 13, and the n-channels in base regions 14. When negative voltages are applied to the second source terminal and the second gate terminal, electron flow in the direction opposite to the direction described above.

The bidirectional super-junction MOSFET is switched to the ON-state from the OFF-state, therein a positive voltage higher than the first source potential is applied to the second source terminal and the second gate terminal, by applying a positive voltage higher than the first source potential to the first gate terminal. The electrons that have reached high resistivity region 13 on the side of the second MOSFET from first source terminal via the n-channels formed in the surface portions of base regions 4 apply a forward bias voltage to the pn-junctions between baser regions 14 and high resistivity region 13. As a result, holes are injected from base regions 14. Since the injected holes modulate the conductivity of the alternating conductivity type layer, the conductivity of high resistivity region 3 and the conductivity of high resistivity region 13, the on-voltage is lowered. This is the so-called IGBT mode of operation.

The bidirectional super-junction MOSFET is switched to the ON-state from the OFF-state, therein a negative voltage lower than the first source potential is applied to the second source terminal and the second gate terminal, by applying a positive voltage higher than the second source potential to the second gate terminal. The operation is the same with the operation described in the above paragraph except that the flow direction of the current is opposite. Although the switching speed in the IGBT mode of operation is slower than that in the foregoing MOSFET mode of operation due to minority carrier accumulation in drift regions 1, the IGBT mode of operation is advantageous to obtain a low on-voltage in the high current region.

According to the first embodiment, a current is made flow from the first MOSFET to the second MOSFET and vice versa and the on-resistance in the opposite directions is reduced. A high breakdown voltage is obtained also in the opposite directions. The MIS semiconductor devices formed in the device regions facilitate reducing the power consumption in the drive circuit and simplifying the drive circuit. Since the bidirectional super-junction MOSFET according to the first embodiment is manufactured by bonding the back surfaces of the first half device including a first MOSFET and an alternating conductivity type layer and the second half device including a second MOSFET and an alternating conductivity type layer, the alternating conductivity type layers are formed easily even when the aspect ratios of drift regions 1 and partition regions 2 are high. Therefore, the manufacturing process is simplified and the manufacturing costs are reduced.

Second Embodiment

Figure 7:
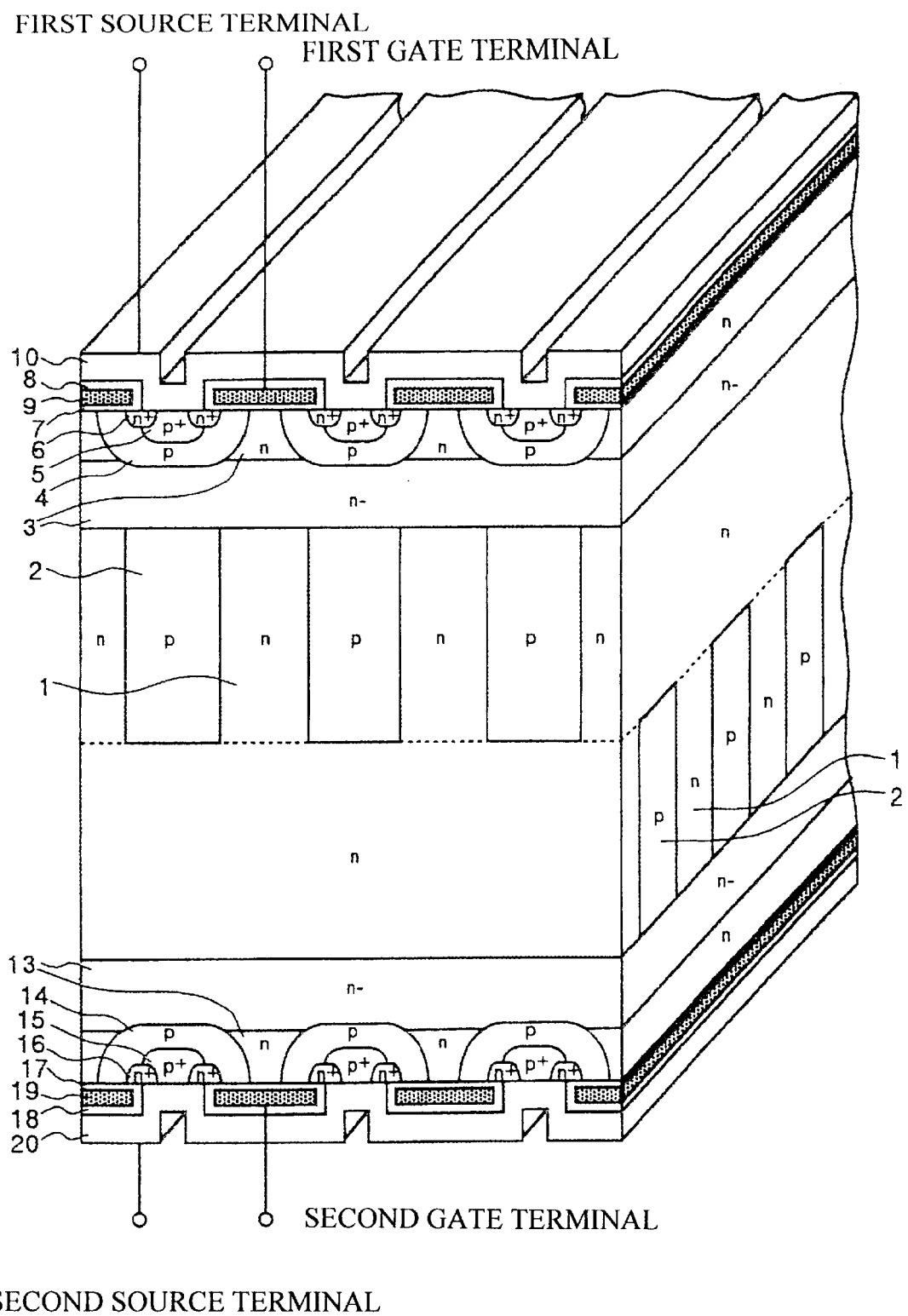
FIG. 7 is a perspective cross sectional view of a vertical bidirectional super-junction MOSFET according to a second embodiment of the invention.

FIG. 7 is a perspective cross sectional view of a vertical bidirectional super-junction MOSFET according to a second embodiment of the invention. In FIG. 7, the same reference numerals as used in FIG. 1 are used to designate the same constituent elements and their duplicated explanations are omitted for the sake of the simplicity.

Referring now to FIG. 7, the bidirectional super-junction MOSFET according to the second embodiment is different from the bidirectional super-junction MOSFET according to the first embodiment in the following three points. First, the bidirectional super-junction MOSFET according to the second embodiment includes a first alternating conductivity type layer formed on the side of a first MOSFET and a second alternating conductivity type layer formed on the side of a second MOSFET. Second, the boundaries between drift regions 1 and partition regions 2 in the first alternating conductivity type layer extend almost in perpendicular to the boundaries between drift regions 1 and partition regions 2 in the second alternating conductivity type layer. Third, base regions 14 of the second MOSFET extend in perpendicular to the boundaries between drift regions 1 and partition regions 2 in the second alternating conductivity type layer. The other structures are the same with those of the bidirectional super-junction MOSFET according to the first embodiment.

Drift regions 1 in the first alternating conductivity type layer and drift regions 1 in the second alternating conductivity type layer are connected to each other at respective parts thereof. Similarly, partition regions 2 in the first alternating conductivity type layer and partition regions 2 are connected to each other at respective parts thereof.

The bidirectional super-junction MOSFET according to the second embodiment is manufactured in the following way. The back surface of a first half device including the first MOSFET and the first alternating conductivity type layer and the back surface of a second half device including the second MOSFET and the second alternating conductivity type layer are polished. The polished back surfaces of the first half device and the second half device are directly bonded to each other in such an orientation that the boundaries between drift regions 1 and partition regions 2 in the first alternating conductivity type layer extend almost in perpendicular to the boundaries between drift regions 1 and partition regions 2 in the second alternating conductivity type layer. Since other manufacturing steps are the same with the steps for manufacturing the bidirectional super-junction MOSFET according to the first embodiment, their duplicated explanations are omitted.

Since the operations of the bidirectional super-junction MOSFET according to the second embodiment are the same with those of the bidirectional super-junction MOSFET according to the first embodiment, their duplicated explanations are omitted.

In the same manner as the bidirectional super-junction MOSFET according to the first embodiment, the bidirectional super-junction MOSFET according to the second embodiment facilitates making a current flow from the first MOSFET to the second MOSFET and vice versa, reducing the on-resistance in the opposite directions and obtaining a high breakdown voltage in the opposite directions. The bidirectional super-junction MOSFET according to the second embodiment also facilitates reducing the power consumption of the drive circuit and simplifying the drive circuit due to the employment of the MIS structure. In addition, the bidirectional super-junction MOSFET according to the second embodiment is manufactured easily, since it is not necessary to precisely align the boundaries between drift regions 1 and partition regions 2 of the first and second alternating conductivity type layers according to the second embodiment.

Third Embodiment

Figure 8:
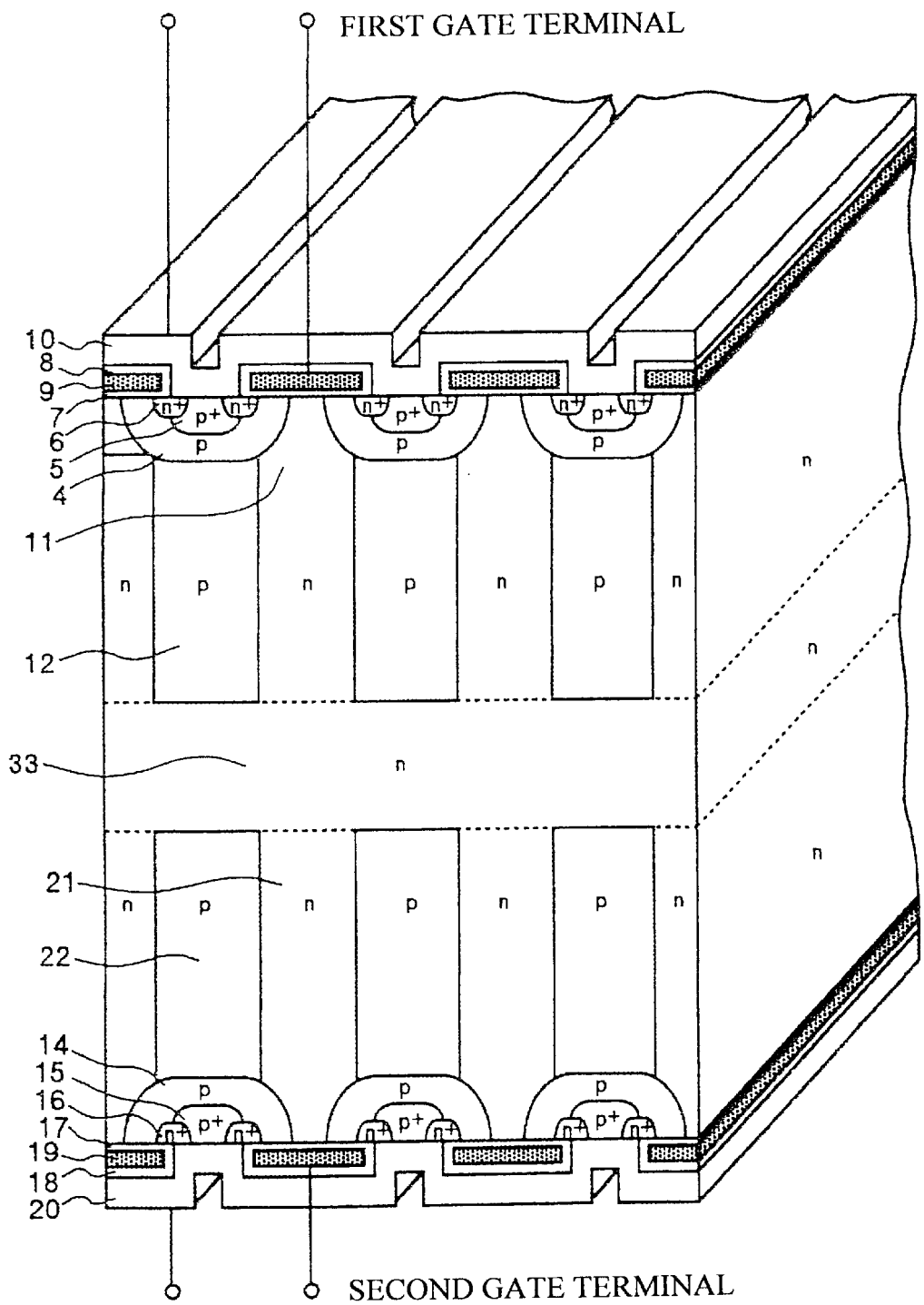
FIG. 8 is a perspective cross sectional view of a vertical bidirectional super-junction MOSFET according to a third embodiment of the invention.

FIG. 8 is a perspective cross sectional view of a vertical bidirectional super-junction MOSFET according to a third embodiment of the invention. In FIG. 8, the same reference numerals as used in FIG. 1 are used to designate the same constituent elements and their duplicated explanations are omitted for the sake of the simplicity.

Referring now to FIG. 8, the bidirectional super-junction MOSFET according to the third embodiment is different from the bidirectional super-junction MOSFET according to the first embodiment in the following four points. First, the bidirectional super-junction MOSFET according to the third embodiment includes a first alternating conductivity type layer formed on the side of a first MOSFET and a second alternating conductivity type layer formed on the side of a second MOSFET. The first alternating conductivity type layer is formed of drift regions 11 and partition regions 12 arranged alternately. The second alternating conductivity type layer is formed of drift regions 21 and partition regions 22 arranged alternately.

Second, the first alternating conductivity type layer and the second alternating conductivity type layer are isolated by an n-type isolation region 33. Third, bidirectional super-junction MOSFET according to the third embodiment does not include high resistivity region 3 nor high resistivity region 13. Fourth, base regions 4 are connected directly to the first alternating conductivity type layer and base regions 14 directly to the second alternating conductivity type layer. The other structures are the same with those in the bidirectional super-junction MOSFET according to the first embodiment.

According to the third embodiment, the breakdown voltage is maintained by partition regions 12, 22 and isolation region 33. A high breakdown voltage is obtained by appropriately adjusting the impurity concentration and the thickness of isolation region 33. It is necessary to adjust the impurity concentration and the thickness of isolation region 33 at respective appropriate values, thereat the electric field strength on the pn-junctions between partition regions 12 and isolation region 33 is less than the critical value at the voltage necessary to deplete the first alternating conductivity type layer completely and, thereat, depletion layers expanding from the first alternating conductivity type layer never punch through to the second alternating conductivity type layer. Since a part of the n-type substrate is used for isolation region 33, it is necessary to adjust the impurity concentration in the n-type substrate at a predetermined value.

Figure 9:
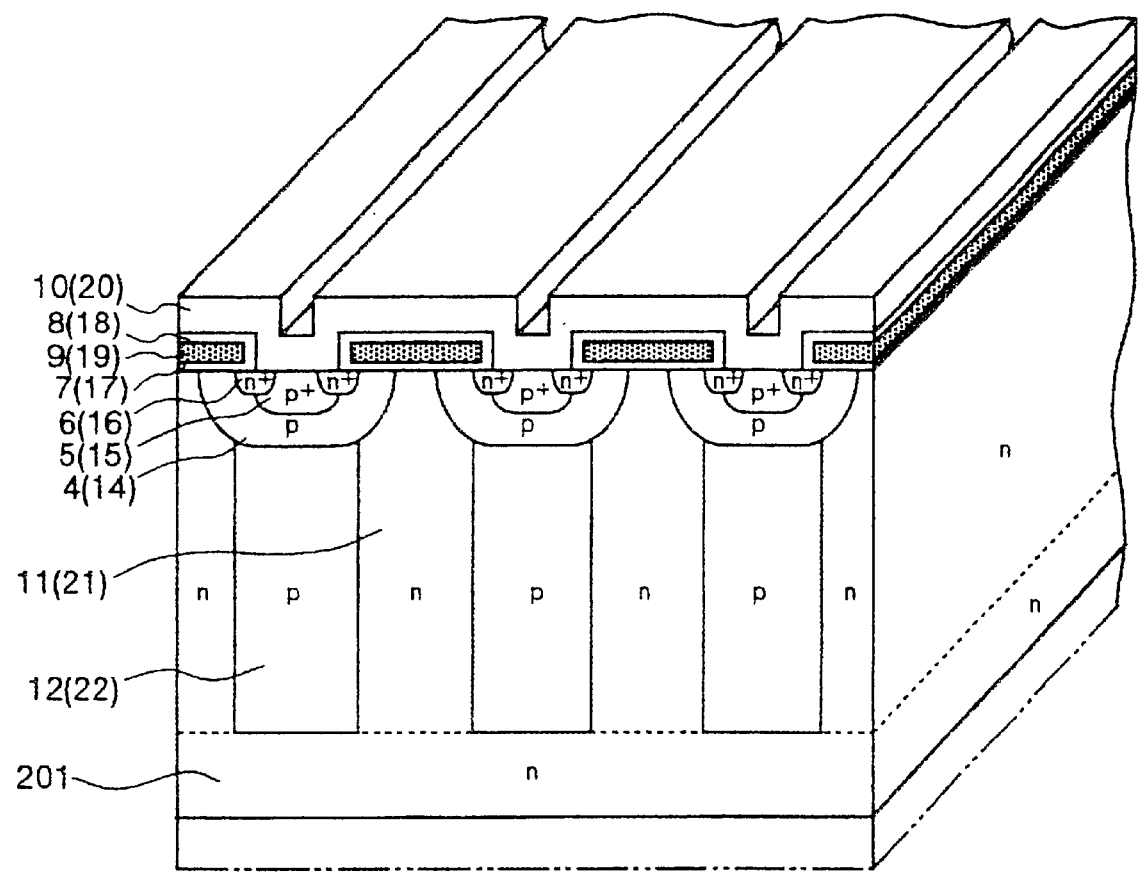
FIG. 9 is a perspective cross sectional view of a half device of the bidirectional super-junction MOSFET according to the third embodiment of the invention for explaining the manufacturing method thereof.

The bidirectional super-junction MOSFET according to the third embodiment is manufactured in the following way. The back surface of a first half device including the first MOSFET and the first alternating conductivity type layer and the back surface of a second half device including the second MOSFET and the second alternating conductivity type layer are polished. More in detail, a part of the back surface of n-type substrate 201 and a part of the back surface of another n-type substrate 201 are not removed as shown in FIG. 9 to obtain isolation region 33 of predetermined thickness. The polished back surfaces of n-type substrates 201 and 201 are directly bonded to each other. Since other manufacturing steps are the same with the steps for manufacturing the bidirectional super-junction MOSFET according to the first embodiment, their duplicated explanations are omitted.

In the same manner as the bidirectional super-junction MOSFET according to the first embodiment, the bidirectional super-junction MOSFET according to the third embodiment facilitates making a current flow from the first MOSFET to the second MOSFET and vice versa, reducing the on-resistance in the opposite directions and obtaining a high breakdown voltage in the opposite directions. The bidirectional super-junction MOSFET according to the third embodiment also facilitates reducing the power consumption of the drive circuit and simplifying the drive circuit due to the employment of the MIS structure.

Fourth Embodiment

Figure 10:
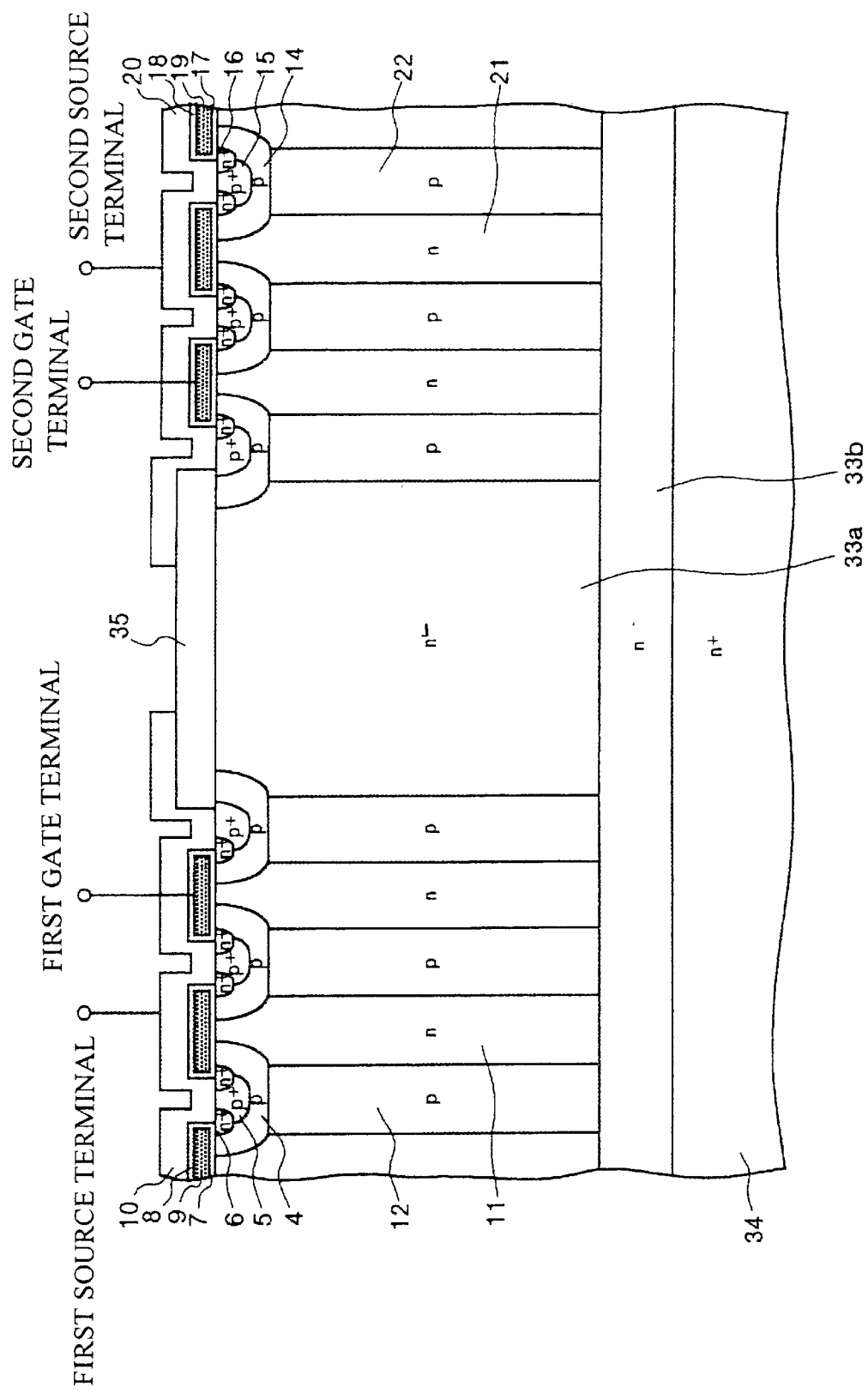
FIG. 10 is a cross sectional view of a vertical bidirectional super-junction MOSFET according to a fourth embodiment of the invention.

FIG. 10 is a cross sectional view of a vertical bidirectional super-junction MOSFET according to a fourth embodiment of the invention. In FIG. 10, the same reference numerals as used in FIG. 8 are used to designate the same constituent elements and their duplicated explanations are omitted for the sake of the simplicity.

Referring now to FIG. 10, the bidirectional super-junction MOSFET according to the fourth embodiment is a modification of the bidirectional super-junction MOSFET according to the third embodiment. The bidirectional super-junction MOSFET according to the fourth embodiment is different from the bidirectional super-junction MOSFET according to the third embodiment in the following four points.

First, the bidirectional super-junction MOSFET according to the fourth embodiment includes an n$^+$-type layer 34 with low on-resistance, thereon a first MOSFET and a second MOSFET thereof are formed. Second, the first MOSFET and the second MOSFET are on the same horizontal plane. Third, the first alternating conductivity layer in the first MOSFET and the second alternating conductivity layer in the second MOSFET are on the same horizontal plane with the boundary planes between drift regions 11 and partition regions 12 and the boundary planes between drift regions 21 and partition regions 22 extended in parallel to each other. Fourth, the bidirectional super-junction MOSFET according to the fourth embodiment includes an isolation region 33, that includes a high resistivity n$^-$-type region 33$a$ and an n-type region 33$b$.

High resistivity n$^-$-type region 33$a$ is between the first alternating conductivity layer in the first MOSFET and the second alternating conductivity layer in the second MOSFET. The n-type region 33$b$ is beneath the first alternating conductivity layer, the second alternating conductivity layer and high resistivity region 33$a$. The n-type region 33$b$ is on n$^+$-type layer 34. The n-type region 33$b$ is in contact with the first alternating conductivity layer, the second alternating conductivity layer, high resistivity region 33$a$ and n$^+$-type layer 34. The other structures are the same with those in the bidirectional super-junction MOSFET according to the third embodiment.

The bidirectional super-junction MOSFET according to the fourth embodiment is manufactured in the following way.

An n-type layer, that will later be n-type region 33$b$, and an n$^-$-type layer, that will later be n$^-$-type region 33$a$, are grown epitaxially on a layer with low electrical resistance 34. A first resist mask is formed on the laminate formed so far. Boron ions are implanted into the surface portions of the laminate, therein partition regions 12 and 22 will be formed. The first resist mask is removed and a second resist mask is formed on the laminate with the boron atoms implanted therein. Phosphorus ions are implanted into the surface portions of the laminate, therein drift regions 11 and 21 will be formed. The second resist mask is removed.

The steps of the epitaxially growth, the boron ion implantation and the phosphorus ion implantation are repeated until a laminate of a predetermined thickness is obtained. Finally, an uppermost n-type layer is epitaxially grown. Drift regions 11, 21 and partition regions 11, 22 are formed by thermally driving and activating the implanted impurities. The portions of the laminates, therein isolation region 33 will be formed, are covered with the resist masks so that the boron ions and the phosphorus ions may not be implanted therein.

Then, base regions 4 and 14, contact regions 5 and 15, and source regions 6 and 16 are formed through the conventional manufacturing steps for manufacturing a double-diffused MOSFET. Then, gate oxide films (gate insulation films) 7 and 17 and polycrystalline silicon gate electrodes 9 and 19 are formed. Interlayer insulation films 8 and 18 are deposited on gate electrodes 9 and 19. Contact holes are bored through interlayer insulation films 8 and 18. Source electrodes 10 and 20 are formed by sputtering a metal silicide such as Al—Si.

Now the operations of the bidirectional super-junction MOSFET according to the fourth embodiment will be explained.

First, an OFF-state operation will be explained. In the state, therein the first gate terminal and the first source terminal are electrically connected to each other and the second gate terminal and the second source terminal are electrically connected to each other, a positive voltage higher than the first source potential is applied to the second source terminal and the second gate terminal. As the positive voltage is boosted, the first alternating conductivity type layer is depleted and a depletion layer expands from the pn-junction between partition region 12 in contact with isolation region 33 and isolation region 33 into high resistivity region 33$a$ of isolation region 33. The breakdown voltage is maintained until the depletion layer reaches partition region 22 in contact with isolation region 33 or until vigorous avalanche amplification of the holes injected from partition region 22 occurs in the depleted region expanding in front. When a negative voltage lower than the first source potential is applied to the second source terminal and the second gate terminal, the operation of the bidirectional super-junction MOSFET of FIG. 1 is the inversion of the operation described above.

The bidirectional super-junction MOSFET is switched from the OFF-state to the ON-state by forming n-channels in base regions 4 and 14. The n-channels are formed by applying a positive voltage higher than the first source potential to the first gate terminal and a positive voltage higher than the second source potential to the second gate terminal. When a positive bias voltage higher than the first source potential is applied to the second source terminal, electrons flow through drift regions 11 vertically from the first source terminal via the n-channels in base regions 4. The current, that has reached n-type region 33b, flows through n-type region 33b toward the second alternating conductivity type layer and then to the second source terminal via drift regions 21 and the n-channels in base regions 14. When the bias voltage applied to the second gate terminal is lower than the first source potential, the current flow direction is opposite to that described above.

In the same manner as the bidirectional super-junction MOSFET according to the third embodiment, the bidirectional super-junction MOSFET according to the fourth embodiment facilitates making a current flow from the first MOSFET to the second MOSFET and vice versa, reducing the on-resistance in the opposite directions and obtaining a high breakdown voltage in the opposite directions. The bidirectional super-junction MOSFET according to the fourth embodiment also facilitates reducing the power consumption of the drive circuit and simplifying the drive circuit due to the employment of the MIS structure.

Fifth Embodiment

Figure 11:
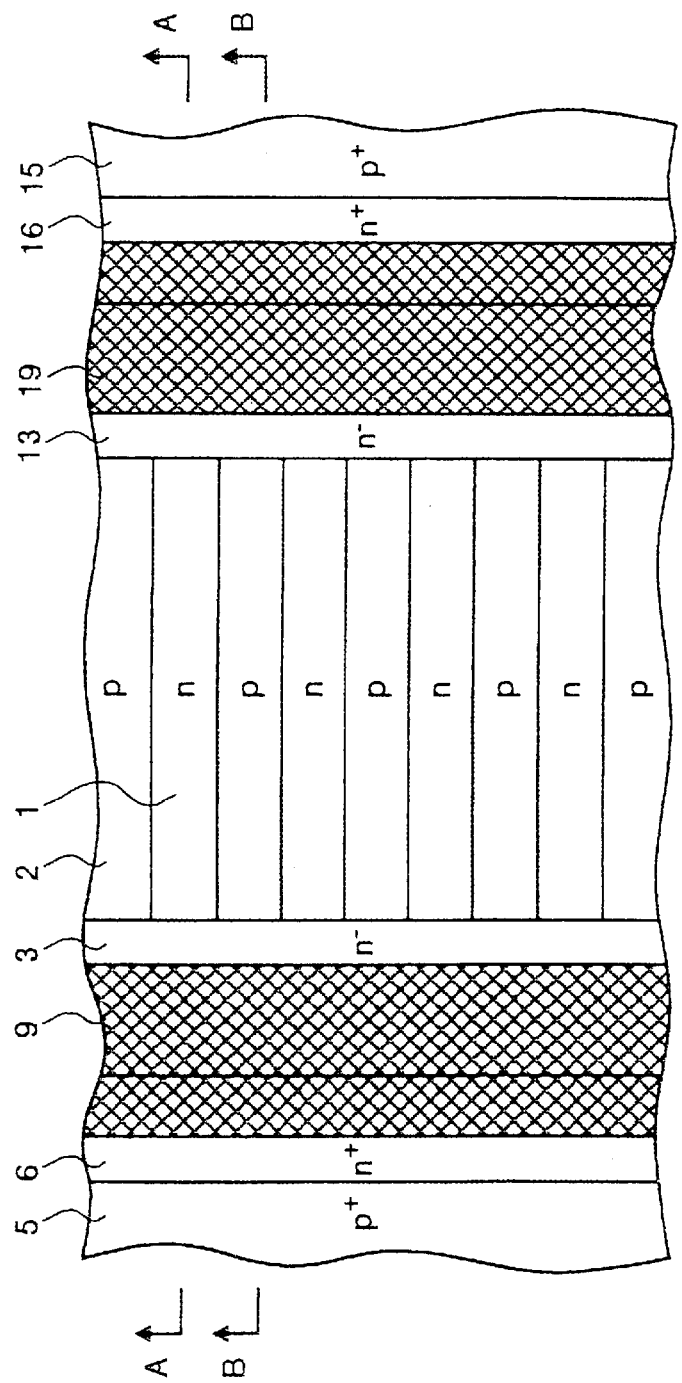
FIG. 11 is a top plan view of a lateral bidirectional super-junction MOSFET according to a fifth embodiment of the invention.
Figure 12:
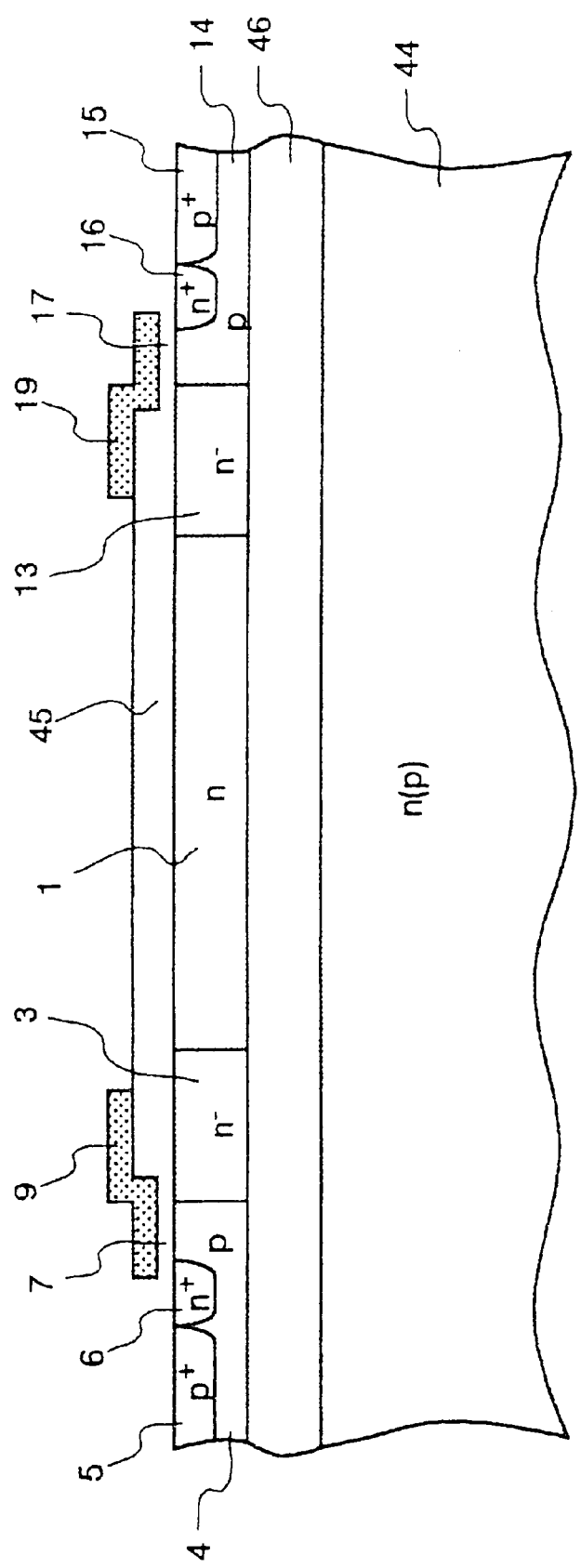
FIG. 12 is a cross section along A–A of FIG. 11.
Figure 13:
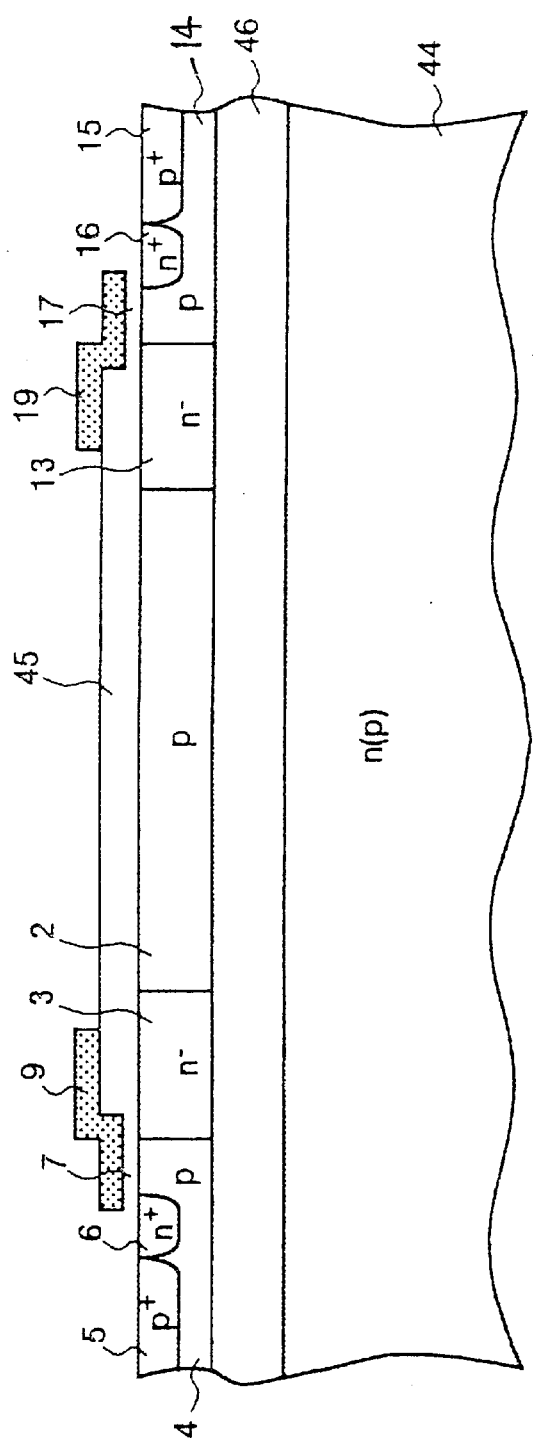
FIG. 13 is a cross section along B–B of FIG. 11.

FIG. 11 is a top plan view of a lateral bidirectional super-junction MOSFET according to a fifth embodiment of the invention. FIG. 12 is a cross section along A–A of FIG. 11. FIG. 13 is a cross section along B–B of FIG. 11.

The bidirectional super-junction MOSFET according to the fifth embodiment includes an SOI substrate formed of an n-type semiconductor substrate or a p-type substrate 44 and an insulation film 46 formed on the substrate 44. The bidirectional super-junction MOSFET according to the fifth embodiment further includes, on the SOI substrate thereof, a first device region including a first MOSFET, a second device region including a second MOSFET, and an alternating conductivity type layer between the first MOSFET and the second MOSFET.

The alternating conductivity type layer is formed of rectangular n-type drift regions 1 and rectangular p-type partition regions 2 alternately arranged and extending along insulation film 46. The alternating conductivity type layer contacts with an n-type high resistivity region 3 of the first MOSFET and an n-type high resistivity region 13 of the second MOSFET. Although the bidirectional super-junction MOSFET according to the fifth embodiment is a lateral device and the bidirectional super-junction MOSFET according to the first embodiment is a vertical device, the structure and the operations of the bidirectional super-junction MOSFET according to the fifth embodiment are essentially the same with those of the bidirectional super-junction MOSFET according to the first embodiment. Therefore, the same reference numerals as used in FIG. 1 are used to designate the same constituent elements in FIGS. 11 through 13, and their duplicated explanations and the duplicated explanations on the operations of the bidirectional super-junction MOSFET according to the fifth embodiment are omitted.

Since p-type base regions 4 are between high resistivity region 3 and the SOI substrate and p-type base regions 14 are between high resistivity region 13 and the SOI substrate according to the fifth embodiment, a high breakdown voltage is obtained in the opposite directions between the first MOSFET and the second MOSFET. Since the width of drift region 1 and the width of partition region 2 are almost the same, the impurity amount in drift region 1 and the impurity amount in partition region 2 are almost the same. When the width of drift region 1 and the width of partition region 2 are different from each other, it is necessary to adjust the dose amounts in drift region 1 and in partition region 2 at respective values, thereat the impurity concentrations in drift region 1 and partition region 2 are the same. Since the current flows through heavily doped drift regions 1, the on-resistance is reduced.

The dimensions and the impurity concentrations of the constituent regions in the lateral bidirectional super-junction MOSFET of the 500 V class having the structure described above are as follows. The drift region is 30.0 μm in width. The widths of n-type drift region 1 and p-type partition region 2 are 8.0 μm. The impurity concentrations in n-type drift region 1 and p-type partition region 2 are $2.0 \times 10^{15}$ cm$^{-3}$. The depths of n-type drift region 1 and p-type partition region 2 are 2.0 μm. High resistivity regions 3 and 13 are 16.0 μm in width. The impurity concentrations in high resistivity regions 3 and 13 are $3.0 \times 10^{14}$ cm$^{-3}$. The diffusion depths of base regions 4 and 14 are 2.0 μm. The surface impurity concentrations of base regions 4 and 14 are $2.0 \times 10^{17}$ cm$^{-3}$. The diffusion depths of contact regions 5 and 15 are 0.5 μm. The surface impurity concentrations of contact regions 5 and 15 are $4.0 \times 10^{19}$ cm$^{-3}$. The diffusion depths of source regions 6 and 16 are 0.5 μm. The surface impurity concentrations of source regions 6 and 16 are $3.0 \times 10^{20}$ cm$^{-3}$.

The lateral bidirectional super-junction MOSFET according to the fifth embodiment is manufactured in the following way. A resist mask for boron ion implantation is formed on the n-type high resistivity layer of the SOI substrate. Boron ions are implanted into the portions of the n-type high resistivity layer, therein partition regions 2 will be formed. The resist mask for boron ion implantation is removed and a resist mask for phosphorus ion implantation is formed on the n-type high resistivity layer of the SOI substrate. Phosphorus ions are implanted into the portions of the n-type high resistivity layer, therein drift regions 1 will be formed. The portions of the n-type high resistivity layer, therein high resistivity regions 3 and 13 will be formed, are covered with the resist masks to prevent the boron ions and the phosphorus ions from being implanted therein. Then, drift regions 1 and partition regions 2 are formed by thermally driving and activating the implanted boron atoms and the implanted phosphorus atoms.

Then, base regions 4 and 14, contact regions 5 and 15, and source regions 6 and 16 are formed through the conventional manufacturing steps for manufacturing a double-diffused MOSFET. Then, gate oxide films (gate insulation films) 7 and 17 and polycrystalline silicon gate electrodes 9 and 19 are formed. Interlayer insulation films 8 and 18 are deposited on gate electrodes 9 and 19. Contact holes are bored through interlayer insulation films 8 and 18. Although not shown in FIGS. 11 through 13, source electrodes are formed by sputtering a metal silicide such as Al—Si.

In the same manner as the bidirectional super-junction MOSFET according to the first embodiment, the bidirectional super-junction MOSFET according to the fifth embodiment facilitates making a current flow from the first MOSFET to the second MOSFET and vice versa, reducing the on-resistance in the opposite directions and obtaining a high breakdown voltage in the opposite directions. The bidirectional super-junction MOSFET according to the fifth embodiment also facilitates reducing the power consumption of the drive circuit and simplifying the drive circuit due to the employment of the MIS structure.

Alternatively, the alternating conductivity type layer may include layer-shaped drift regions and layer-shaped partition regions laminated laterally and alternately. The gate structure may be a planar structure or a U-groove structure.

Sixth Embodiment

Figure 14:
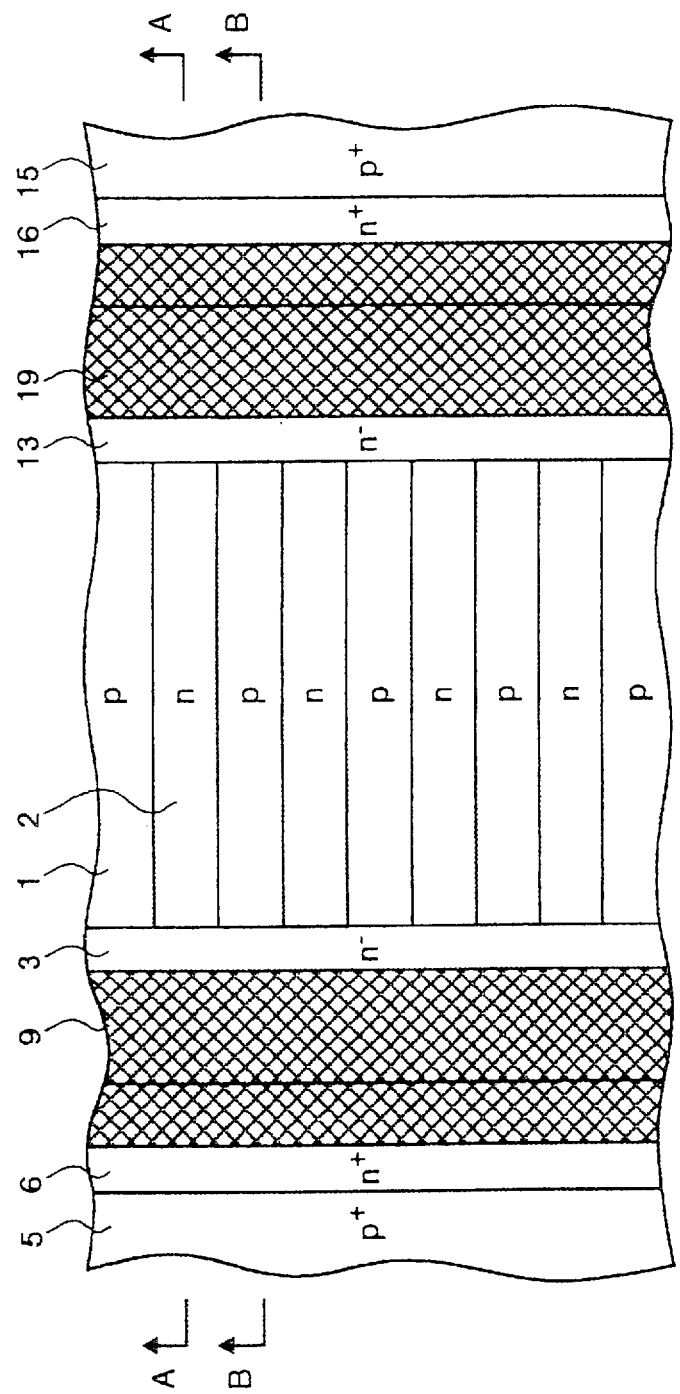
FIG. 14 is a top plan view of a lateral bidirectional super-junction MOSFET according to a sixth embodiment of the invention.
Figure 15:
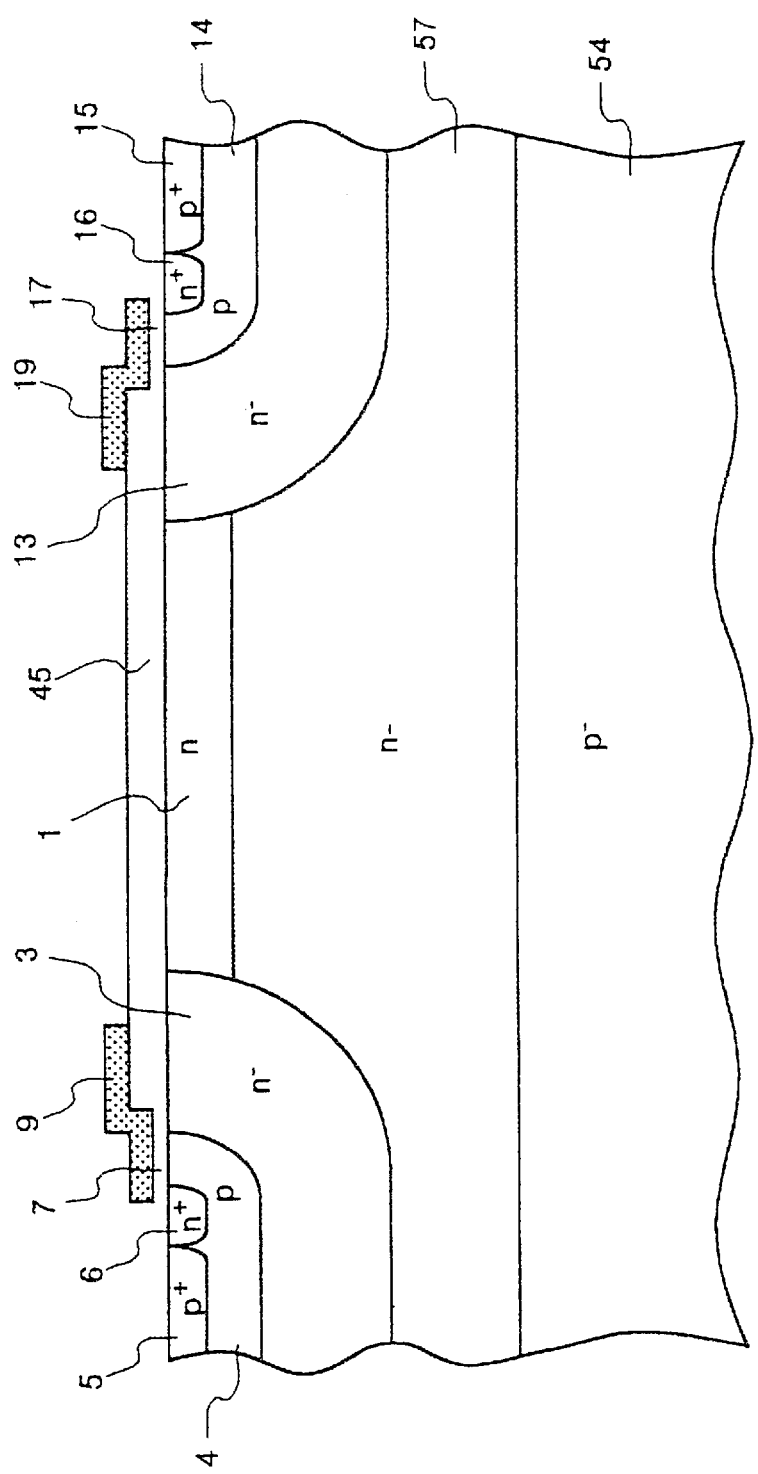
FIG. 15 is a cross section along A–A of FIG. 14.
Figure 16:
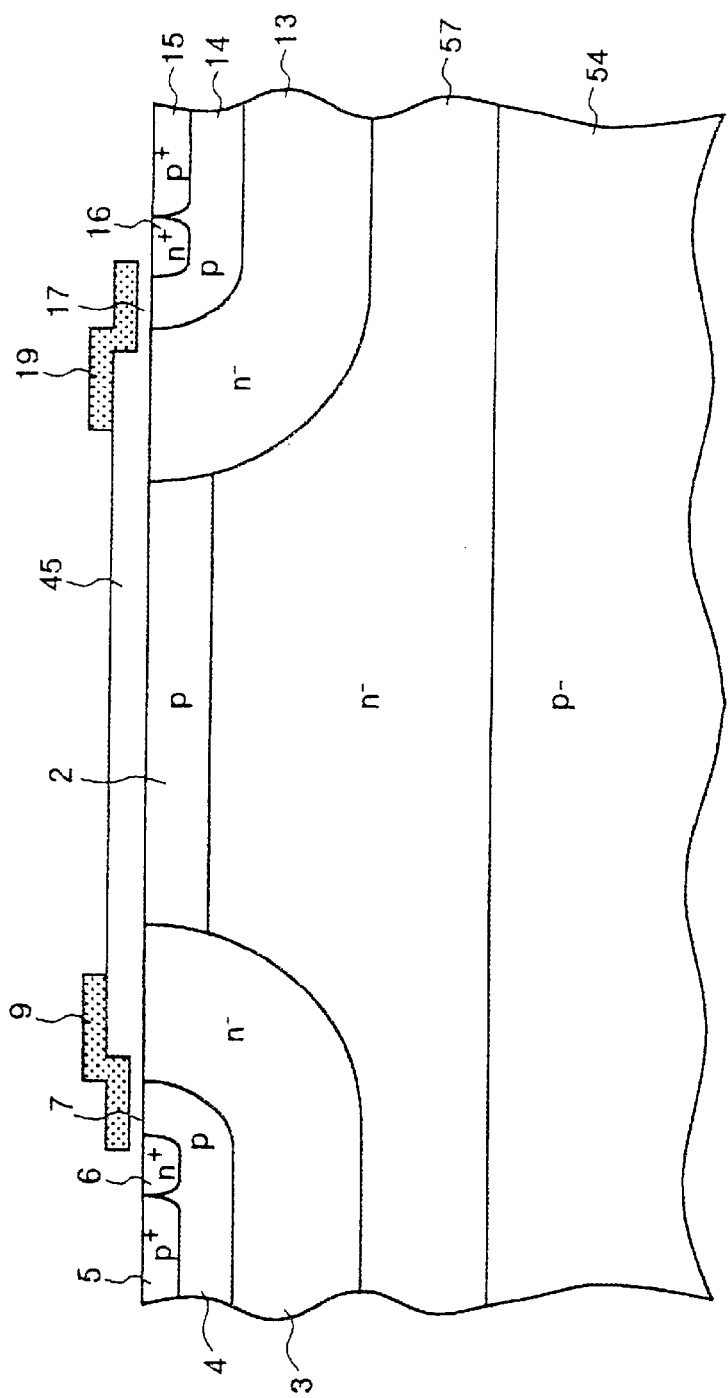
FIG. 16 is a cross section along B–B of FIG. 14.

FIG. 14 is a top plan view of a lateral bidirectional super-junction MOSFET according to a sixth embodiment of the invention. FIG. 15 is a cross section along A–A of FIG. 14. FIG. 16 is a cross section along B–B of FIG. 14.

The bidirectional super-junction MOSFET according to the sixth embodiment is a modification of the bidirectional super-junction MOSFET according to the fifth embodiment. Therefore, the same reference numerals as used in FIGS. 11 through 13 are used in FIGS. 14 through 16 to designate the same constituent elements and their duplicated explanations are omitted for the sake of simplicity.

The bidirectional super-junction MOSFET according to the sixth embodiment includes a semiconductor substrate formed of a high resistivity $n^-$-type semiconductor layer 57 formed on a high resistivity $p^-$-type substrate 54. The other configurations are the same with those of the bidirectional super-junction MOSFET according to the fifth embodiment.

In the OFF-state, depletion layers expand into $n^-$-type semiconductor layer 57 in addition to the flow direction of the current. Therefore, it is necessary to adjust the thickness and the impurity concentration of $n^-$-type semiconductor layer 57 at respective values, thereat the breakdown voltage BVceo between the collector and the emitter with the base opened of the bipolar transistor, formed of p-type base regions 4, 14, $n^-$-type high resistivity regions 3, 13, $n^-$-type semiconductor layer 57 and p-type substrate 54, exceeds the breakdown voltage of the bidirectional super-junction MOSFET. The duplicated explanations of the operations of the bidirectional super-junction MOSFET according to the sixth embodiment same with those of the bidirectional super-junction MOSFET according to the fifth embodiment will be omitted.

The bidirectional super-junction MOSFET according to the sixth embodiment is manufactured in the following way. A high resistivity $n^-$-type semiconductor layer 57 is epitaxially grown on a $p^-$-type substrate 54. A resist mask is formed on $n^-$-type semiconductor layer 57. High resistivity regions 3 and 13 are formed. The resist mask is removed and a resist mask for boron ion implantation is formed on $n^-$-type semiconductor layer 57. Boron ions are implanted into the portions of $n^-$-type semiconductor layer 57, therein partition regions 2 will be formed. The resist mask for boron ion implantation is removed and a resist mask for phosphorus ion implantation is formed on $n^-$-type semiconductor layer 57. Phosphorus ions are implanted into the portions of $n^-$-type semiconductor layer 57, therein drift regions 1 will be formed. Then, drift regions 1 and partition regions 2 are formed by thermally driving and activating the implanted boron atoms and the implanted phosphorus atoms. The subsequent steps for manufacturing the lateral bidirectional super-junction MOSFET according to the sixth embodiment are the same with the steps for manufacturing the lateral bidirectional super-junction MOSFET according to the fifth embodiment.

In the same manner as the bidirectional super-junction MOSFET according to the fifth embodiment, the bidirectional super-junction MOSFET according to the sixth embodiment facilitates making a current flow from the first MOSFET to the second MOSFET and vice versa, reducing the on-resistance in the opposite directions and obtaining a high breakdown voltage in the opposite directions. The MOSFET according to the sixth embodiment also facilitates reducing the power consumption of the drive circuit and simplifying the drive circuit due to the employment of the MIS structure.

Seventh Embodiment

Figure 17:
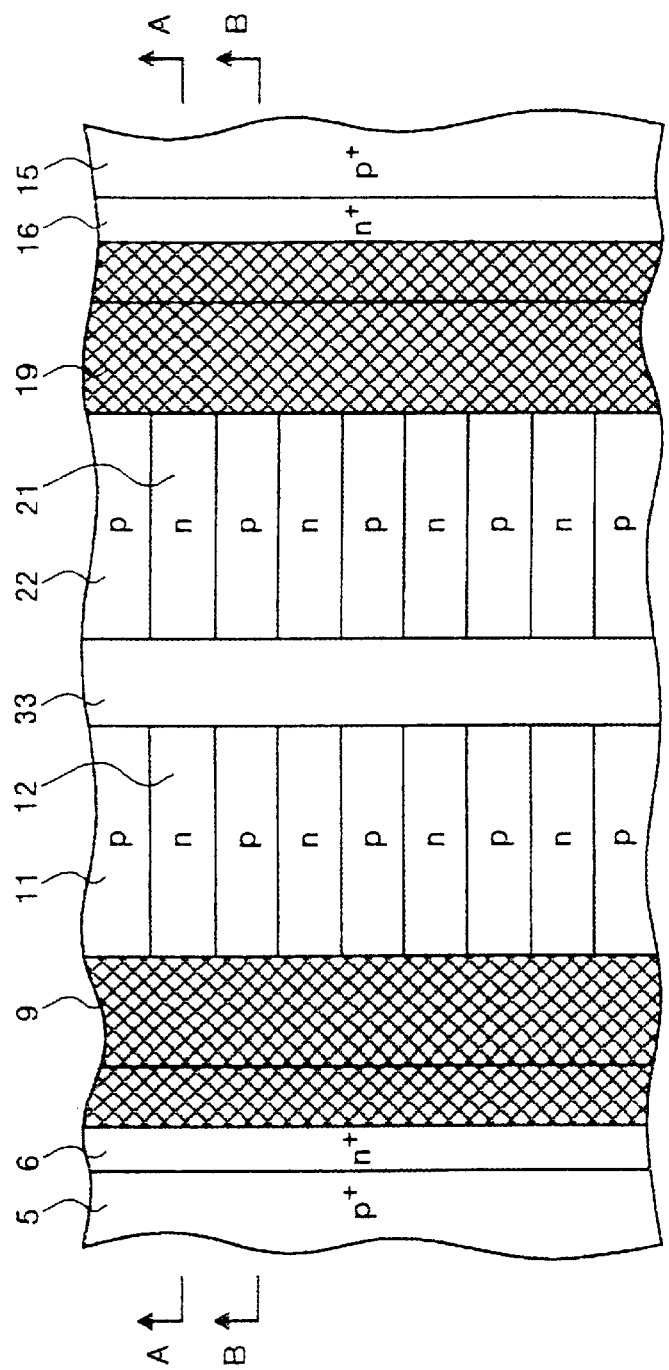
FIG. 17 is a top plan view of a lateral bidirectional super-junction MOSFET according to a seventh embodiment of the invention.
Figure 18:
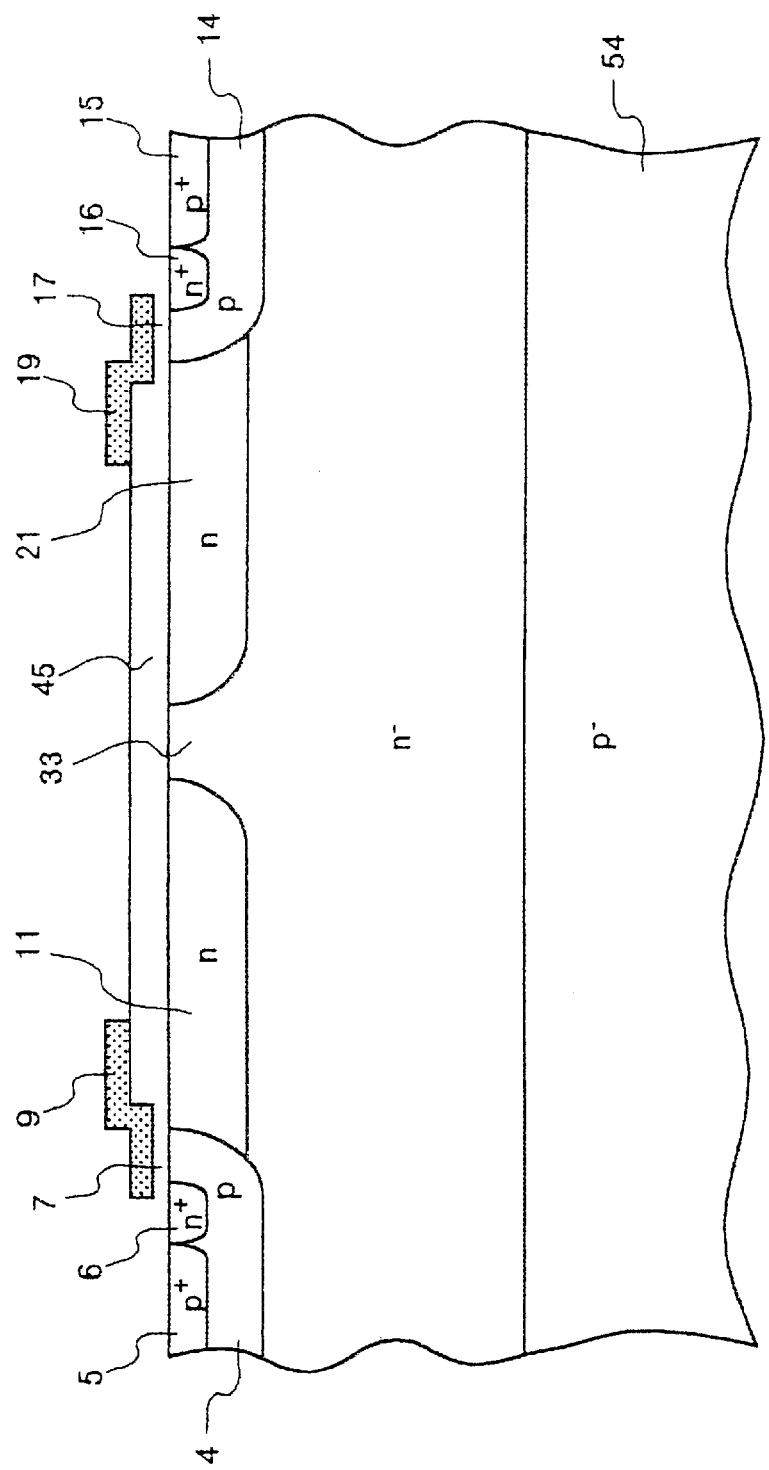
FIG. 18 is a cross section along A–A of FIG. 17.
Figure 19:
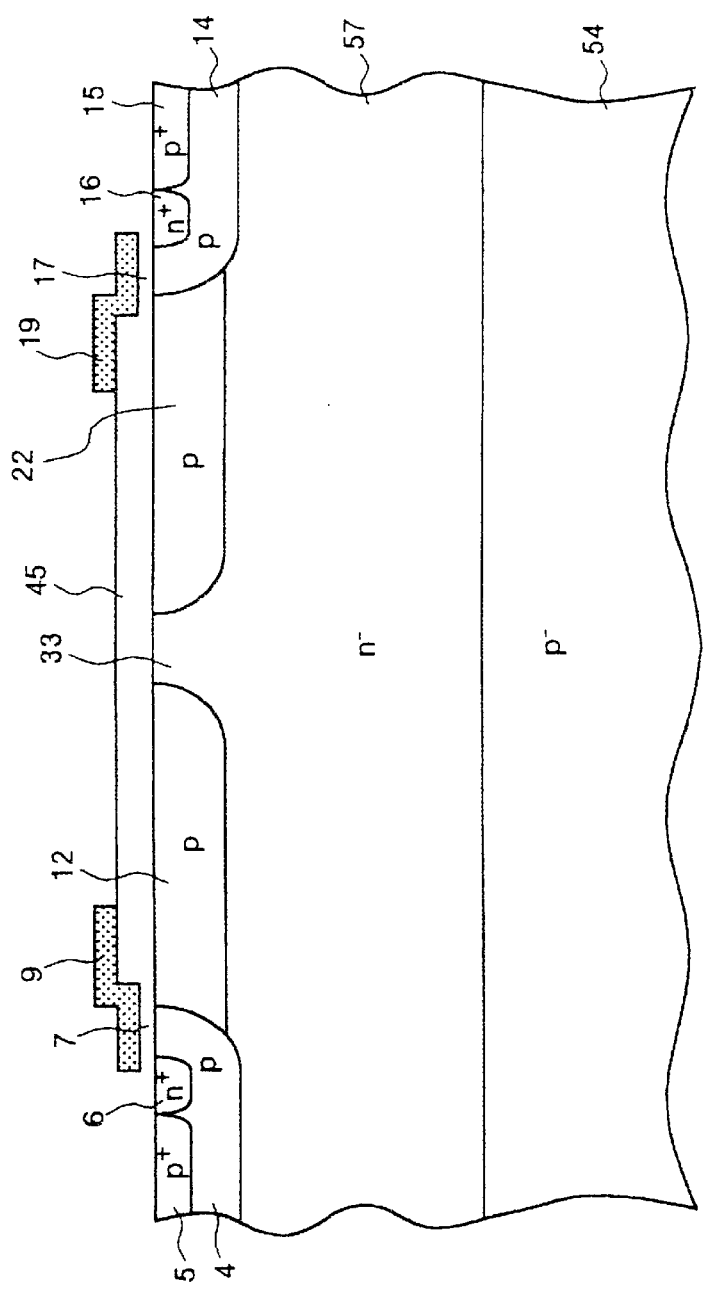
FIG. 19 is a cross section along B–B of FIG. 17.

FIG. 17 is a top plan view of a lateral bidirectional super-junction MOSFET according to a seventh embodiment of the invention. FIG. 18 is a cross section along A–A of FIG. 17. FIG. 19 is a cross section along B–B of FIG. 17. The same reference numerals as used in FIGS. 11 through 13 are used in FIGS. 17 through 19 to designate the same constituent elements and their duplicated explanations are omitted for the sake of simplicity.

The bidirectional super-junction MOSFET according to the seventh embodiment is a modification of the bidirectional super-junction MOSFET according to the sixth embodiment. The bidirectional super-junction MOSFET according to the seventh embodiment is different from the bidirectional super-junction MOSFET according to the sixth embodiment in the following four points. First, the bidirectional super-junction MOSFET according to the seventh embodiment includes a first alternating conductivity type layer formed on the side of the first MOSFET and a second alternating conductivity type layer formed on the side of the second MOSFET. The first alternating conductivity type layer includes drift regions 11 and partition regions 12 alternately arranged. The second alternating conductivity type layer includes drift regions 21 and partition regions 22 alternately arranged.

Second, an n-type isolation region 33 isolates the first alternating conductivity type layer and the second alternating conductivity type layer from each other. The n-type isolation region 33 is a part of $n^-$-type semiconductor layer 57 deposited on $p^-$-type substrate 54. Third, the bidirectional super-junction MOSFET according to the seventh embodiment does not include any high resistivity $n^-$-type region 3 nor 13.

Fourth, base regions 4 of the first MOSFET are connected to the first alternating conductivity type layer and base regions 14 of the second MOSFET to the second alternating conductivity type layer. The other structures are the same with those of the bidirectional super-junction MOSFET according to the fifth embodiment. In other words, the bidirectional super-junction MOSFET according to the seventh embodiment is obtained by modifying the vertical bidirectional super-junction MOSFET according to the third embodiment to a lateral one. Since the bidirectional super-junction MOSFET according to the seventh embodiment operates in the same manner as the bidirectional super-junction MOSFET according to the fifth embodiment, duplicated explanations on the operations thereof will be omitted.

The bidirectional super-junction MOSFET according to the seventh embodiment is manufactured in the following way. A high resistivity n⁻-type semiconductor layer 57 is epitaxially grown on a p⁻-type substrate 54. A resist mask for boron ion implantation is formed on n⁻-type semiconductor layer 57. Boron ions are implanted into the portions of n⁻-type semiconductor layer 57, therein partition regions 12 and 22 will be formed. The resist mask for boron ion implantation is removed and a resist mask for phosphorus ion implantation is formed on n⁻-type semiconductor layer 57. Phosphorus ions are implanted into the portions of n⁻-type semiconductor layer 57, therein drift regions 11 and 21 will be formed. The potion of n⁻-type semiconductor layer 57, therein isolation region 33 will formed, is covered with the resist masks so that neither boron ions nor the phosphorus ions may be implanted therein. Then, drift regions 1 and partition regions 2 are formed by thermally driving and activating the implanted boron atoms and the implanted phosphorus atoms. The subsequent steps for manufacturing the bidirectional super-junction MOSFET according to the seventh embodiment are the same with the steps for manufacturing the bidirectional super-junction MOSFET according to the fifth embodiment.

In the same manner as the bidirectional super-junction MOSFET according to the fifth embodiment, the bidirectional super-junction MOSFET according to the seventh embodiment facilitates making a current flow from the first MOSFET to the second MOSFET and vice versa, reducing the on-resistance in the opposite directions and obtaining a high breakdown voltage in the opposite directions. The bidirectional super-junction MOSFET according to the seventh embodiment also facilitates reducing the power consumption of the drive circuit and simplifying the drive circuit due to the employment of the MIS structure.

Eighth Embodiment

Figure 20:
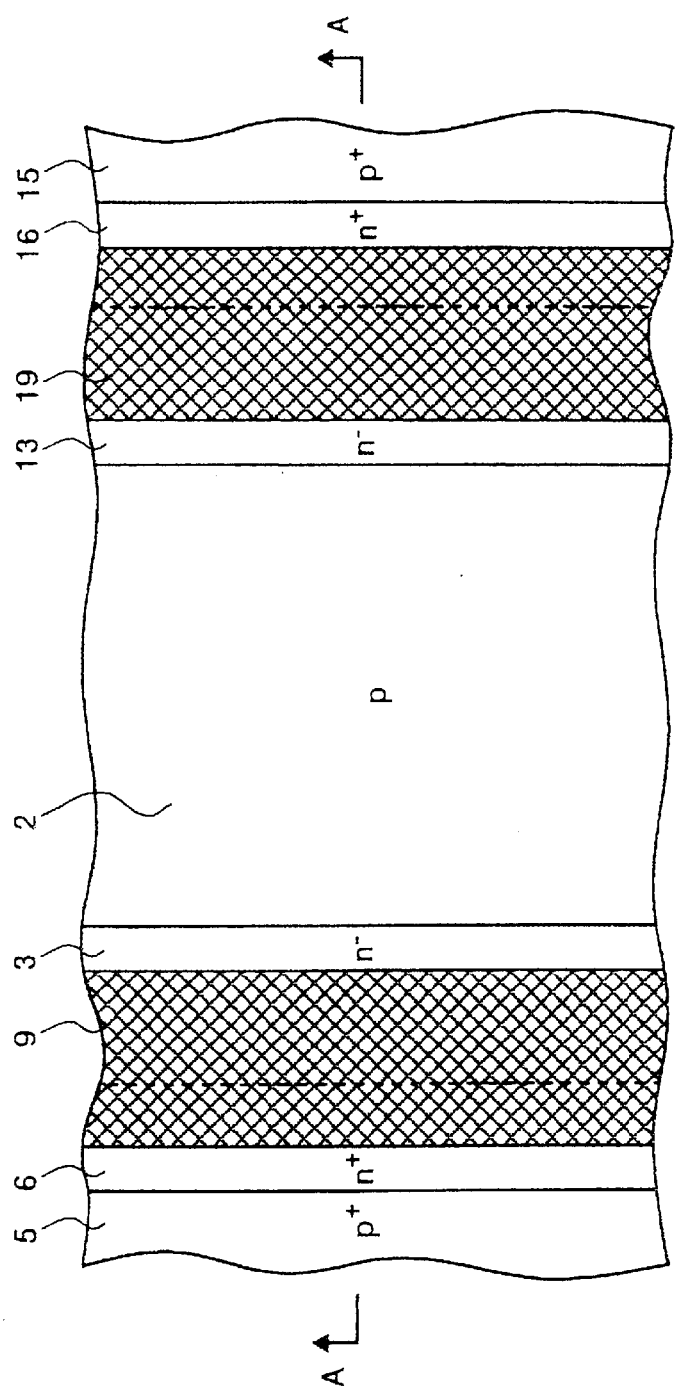
FIG. 20 is a top plan view of a lateral bidirectional super-junction MOSFET according to an eighth embodiment of the invention.
Figure 21:
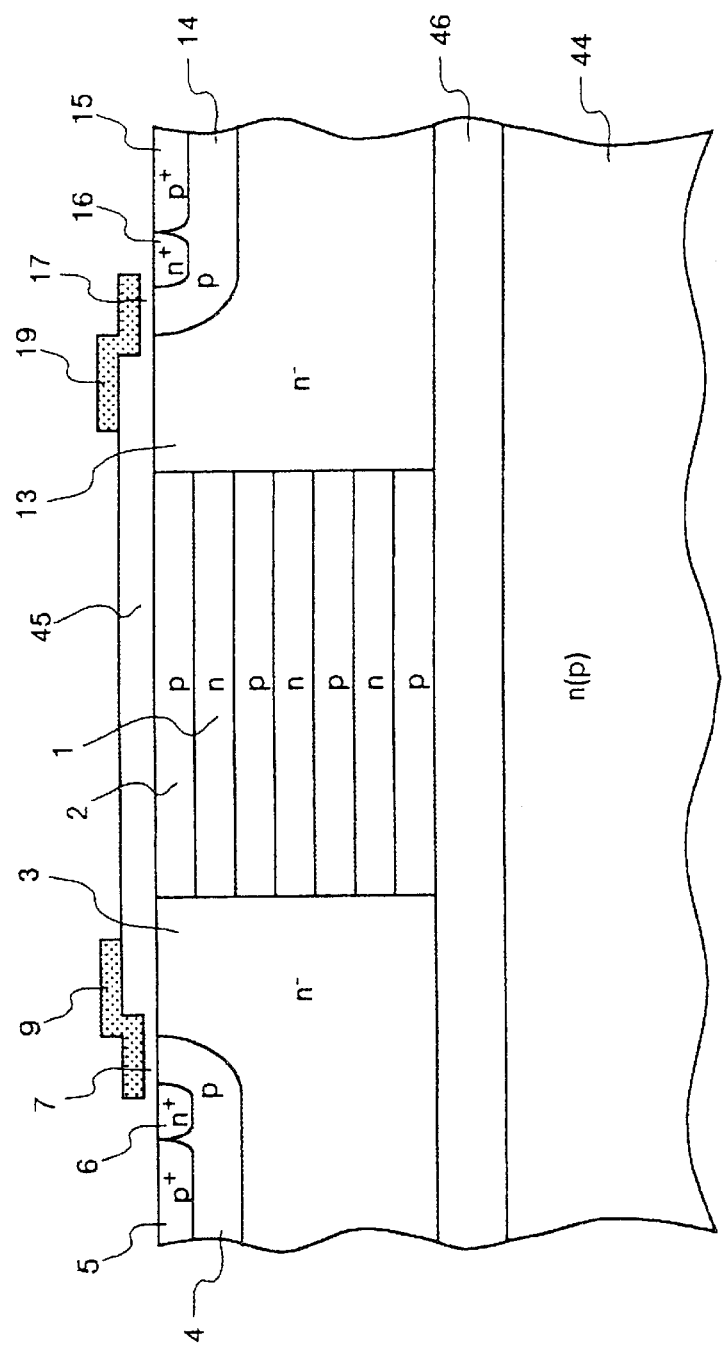
FIG. 21 is a cross section along A–A of FIG. 20.

FIG. 20 is a top plan view of a lateral bidirectional super-junction MOSFET according to an eighth embodiment of the invention. FIG. 21 is a cross section along A–A of FIG. 20. The same reference numerals as used in FIGS. 11 through 13 are used in FIGS. 20 and 21 to designate the same constituent elements and their duplicated explanations are omitted for the sake of simplicity.

The bidirectional super-junction MOSFET according to the eighth embodiment is a modification of the bidirectional super-junction MOSFET according to the fifth embodiment. The bidirectional super-junction MOSFET according to the eighth embodiment is different from the bidirectional super-junction MOSFET according to the fifth embodiment in that the bidirectional super-junction MOSFET according to the eighth embodiment includes an alternating conductivity type layer formed of layer-shaped drift regions 1 and layer-shaped partition regions 2 alternately laminated vertically. The other configurations are the same with those of the bidirectional super-junction MOSFET according to the fifth embodiment. Since the bidirectional super-junction MOSFET according to the eighth embodiment operates in the same manner as the bidirectional super-junction MOSFET according to the fifth embodiment, duplicated explanations on the operations thereof will be omitted.

The bidirectional super-junction MOSFET according to the eighth embodiment is manufactured in the following way. A resist mask for boron ion implantation is formed on the n-type high resistivity layer of the SOI substrate. Boron ions are implanted into the portion of the n-type high resistivity layer, therein partition region 2 will be formed. The resist mask for boron ion implantation is removed. An n-type high resistivity layer is epitaxially grown and a resist mask for phosphorus ion implantation is formed on the epitaxially grown n-type high resistivity layer. Phosphorus ions are implanted into the portion of the n-type high resistivity layer, therein drift region 1 will be formed. The portions of the n-type high resistivity layers, therein high resistivity regions 3 and 13 will be formed, are covered with the resist masks to prevent the boron ions and the phosphorus ions from being implanted therein.

The step sequence of the epitaxial growth, the boron ion implantation, the epitaxial growth and the phosphorus ion implantation is repeated until an epitaxial laminate of a predetermined thickness is obtained. Then, drift regions 1 and partition regions 2 are formed by thermally driving and activating the implanted boron atoms and the implanted phosphorus atoms. It is preferable for the uppermost epitaxial layer for forming the alternating conductivity type layer to be of p-type.

Then, base regions 4 and 14, contact regions 5 and 15, and source regions 6 and 16 are formed through the conventional manufacturing steps for manufacturing a double-diffused MOSFET. Then, gate oxide films (gate insulation films) 7 and 17 and polycrystalline silicon gate electrodes 9 and 19 are formed in the surface portions of high resistivity layers 3 and 13 on the opposite sides of the alternating conductivity type layer. Interlayer insulation films 8 and 18 are deposited on gate electrodes 9 and 19. Contact holes are bored through an interlayer insulation film 45. Although not shown in FIGS. 20 through 21, source electrodes are formed by sputtering a metal silicide such as Al—Si.

In the same manner as the bidirectional super-junction MOSFET according to the fifth embodiment, the bidirectional super-junction MOSFET according to the eighth embodiment facilitates making a current flow from the first MOSFET to the second MOSFET and vice versa, reducing the on-resistance in the opposite directions and obtaining a high breakdown voltage in the opposite directions. The bidirectional super-junction MOSFET according to the eighth embodiment also facilitates reducing the power consumption of the drive circuit and simplifying the drive circuit due to the employment of the MIS structure.

Ninth Embodiment

Figure 22:
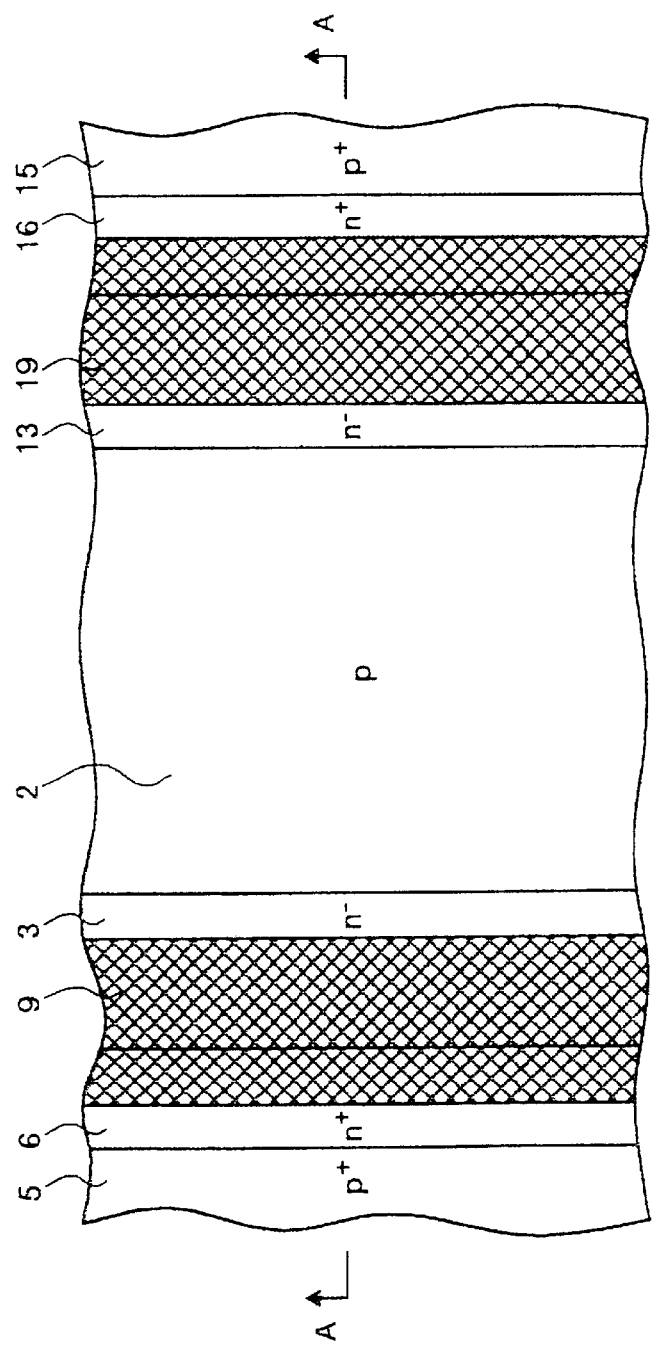
FIG. 22 is a top plan view of a lateral bidirectional super-junction MOSFET according to a ninth embodiment of the invention.
Figure 23:
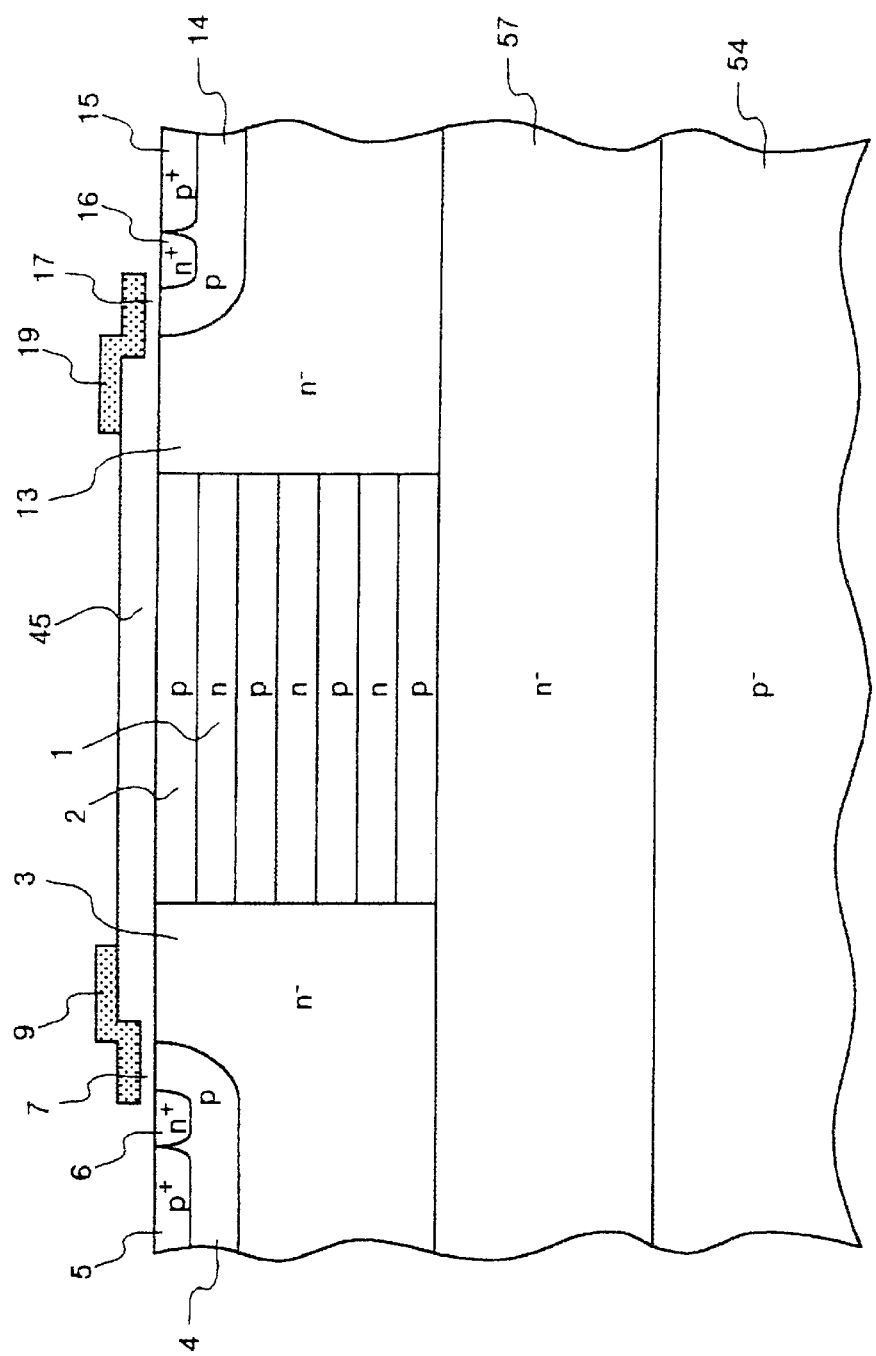
FIG. 23 is a cross section along A–A of FIG. 22.

FIG. 22 is a top plan view of a lateral MOSFET according to a ninth embodiment of the invention. FIG. 23 is a cross section along A–A of FIG. 22. The same reference numerals as used in FIGS. 20 and 21 are used in FIGS. 22 and 23 to designate the same constituent elements and their duplicated explanations are omitted for the sake of simplicity.

The bidirectional super-junction MOSFET according to the ninth embodiment is a modification of the bidirectional super-junction MOSFET according to the eighth embodiment. The bidirectional super-junction MOSFET according to the ninth embodiment is different from the bidirectional super-junction MOSFET according to the eighth embodiment in that the bidirectional super-junction MOSFET according to the ninth embodiment includes a semiconductor substrate formed of a high resistivity n⁻-type semiconductor layer 57 formed on a high resistivity p⁻-type substrate 54. The other configurations are the same with those of the bidirectional super-junction MOSFET according to the eighth embodiment. Since the bidirectional super-junction MOSFET according to the ninth embodiment operates in the same manner as the bidirectional super-junction MOSFET according to the eighth embodiment, duplicated explanations on the operations thereof will be omitted.

The bidirectional super-junction MOSFET according to the ninth embodiment is manufactured in the following way. A high resistivity n⁻-type semiconductor layer 57 is epitaxially grown on a p⁻-type substrate 54. A resist mask is formed on n⁻-type semiconductor layer 57. High resistivity regions 3 and 13 are formed. The resist mask is removed and a resist mask for boron ion implantation is formed on n⁻-type semiconductor layer 57. Boron ions are implanted into the portion of n⁻-type semiconductor layer 57, therein partition region 2 will be formed. The resist mask for boron ion implantation is removed. An n⁻-type high resistivity layer is deposited and a resist mask for phosphorus ion implantation is formed on the epitaxially grown n⁻-type layer. Phosphorus ions are implanted into the portion of the epitaxially grown n⁻-type high resistivity layer, therein drift region 1 will be formed. The resist mask for phosphorus ion implantation is removed.

The step sequence of the epitaxial growth, the boron ion implantation, the epitaxial growth and the phosphorus ion implantation is repeated until an epitaxial laminate of a predetermined thickness is obtained. Then, drift regions 1 and partition regions 2 are formed by thermally driving and activating the implanted boron atoms and the implanted phosphorus atoms. It is preferable for the uppermost epitaxial layer for forming the alternating conductivity type layer to be of p-type. The subsequent steps for manufacturing the bidirectional super-junction MOSFET according to the ninth embodiment are the same with the steps for manufacturing the bidirectional super-junction MOSFET according to the eighth embodiment.

In the same manner as the bidirectional super-junction MOSFET according to the eighth embodiment, the bidirectional super-junction MOSFET according to the ninth embodiment facilitates making a current flow from the first MOSFET to the second MOSFET and vice versa, reducing the on-resistance in the opposite directions and obtaining a high breakdown voltage in the opposite directions. The bidirectional super-junction MOSFET according to the ninth embodiment also facilitates reducing the power consumption of the drive circuit and simplifying the drive circuit due to the employment of the MIS structure.

Tenth Embodiment

Figure 24:
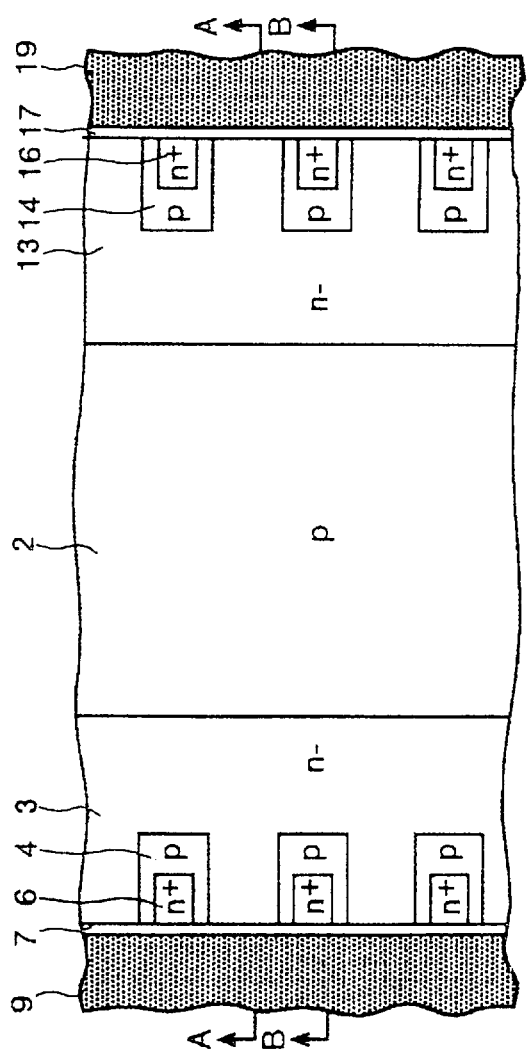
FIG. 24 is a top plan view of a lateral bidirectional super-junction MOSFET according to a tenth embodiment of the invention.
Figure 25:
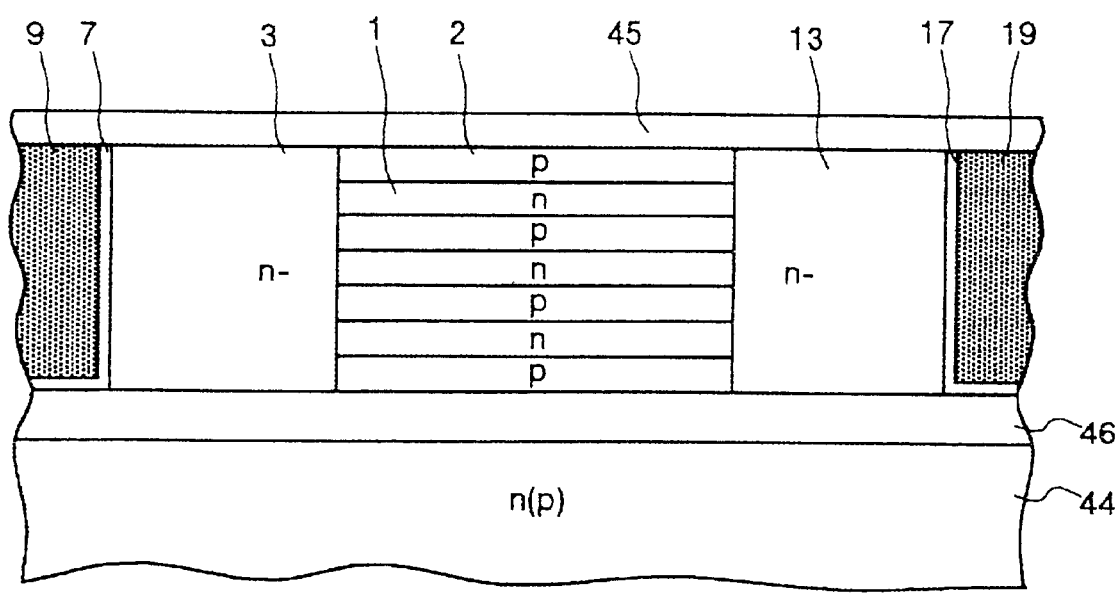
FIG. 25 is a cross section along A–A of FIG. 24.
Figure 26:
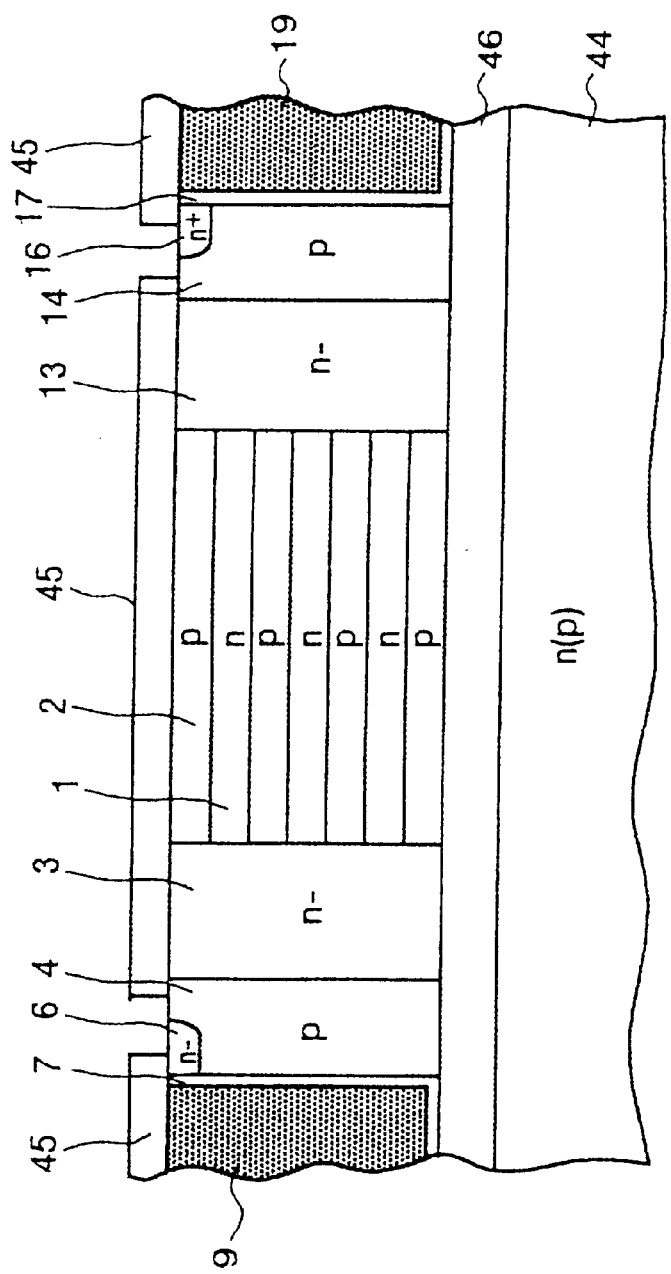
FIG. 26 is a cross section along B–B of FIG. 24.
Figure 27:
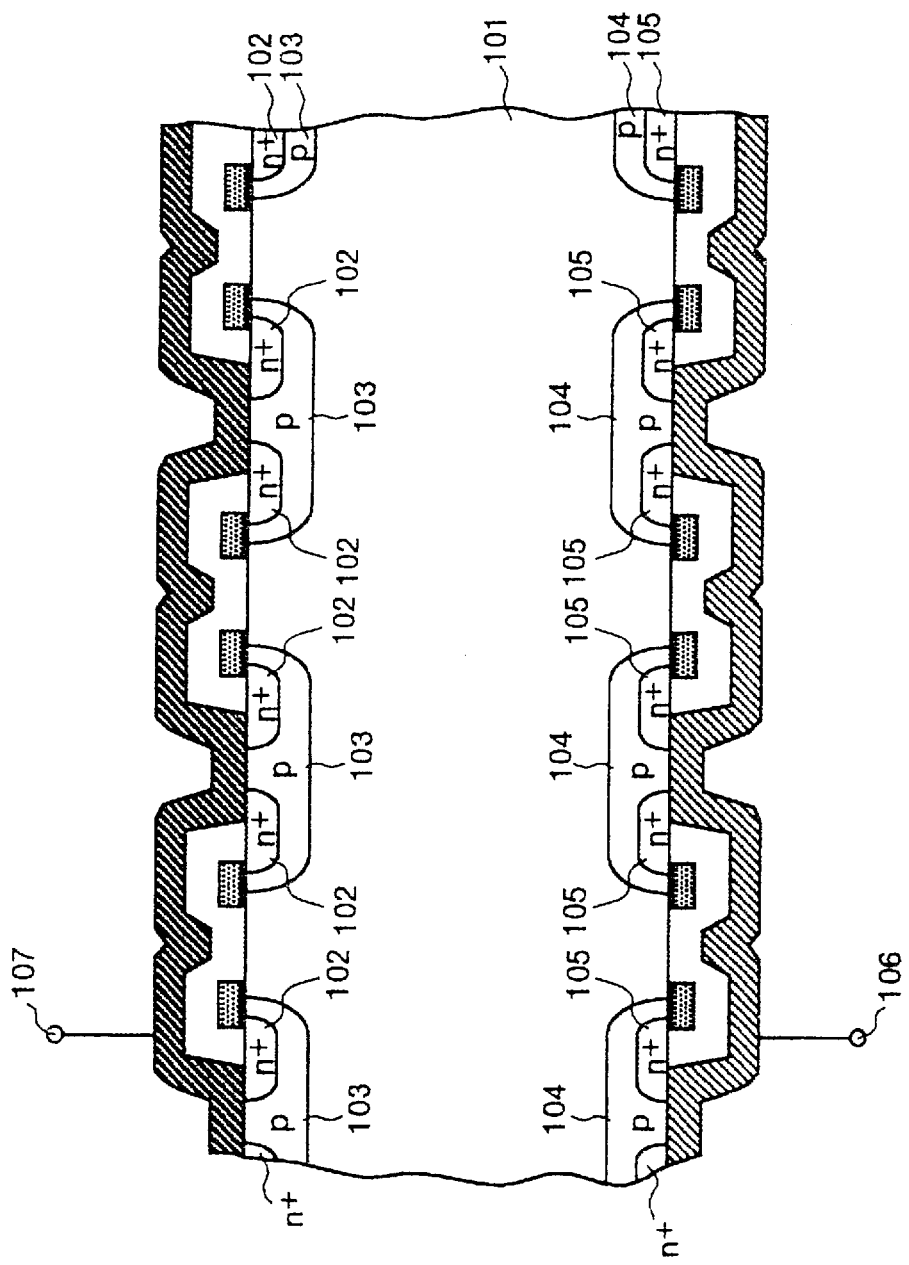
FIG. 27 is a cress sectional view of a conventional vertical bidirectional MOS-type semiconductor device disclosed in Japanese Unexamined Laid Open Patent Application H07-307469.

FIG. 24 is a top plan view of a lateral bidirectional super-junction MOSFET according to a tenth embodiment of the invention. FIG. 25 is a cross section along A–A of FIG. 24. FIG. 26 is a cross section along B–B of FIG. 24.

The bidirectional super-junction MOSFET according to the tenth embodiment is a modification of the bidirectional super-junction MOSFET according to the eighth embodiment. The bidirectional super-junction MOSFET according to the tenth embodiment is different from the bidirectional super-junction MOSFET according to the eighth embodiment in that the super-junction MOSFET according to the tenth embodiment includes trench-type MOSFET's in substitution for the planar MOSFET's in the super-junction MOSFET according to the eighth embodiment. In the super-junction MOSFET according to the tenth embodiment, a first trench is formed by etching in a high resistivity region 3 and a second trench in a high resistivity region 13. A gate insulation film 7 is formed on one side wall of the first trench. A gate insulation film 17 is formed on one side wall of the second trench. Gate insulation film 7 is in contact with base regions 4 and gate insulation film 17 with base regions 14. Source regions 6 are in respective base regions 4 and in contact with gate insulation film 7. Source regions 16 are in respective base regions 14 and in contact with gate insulation film 17. Source regions 6 are isolated from high resistivity region 3 by base regions 4 and source regions 16 from high resistivity region 13 by base regions 14.

A gate electrode 9 is in contact with gate insulation film 7 and a gate electrode 19 with gate insulation film 17. Gate electrode 9 is facing opposite to source electrodes 6 with gate insulation film 7 interposed therebetween. And, gate electrode 19 is facing opposite to source electrodes 16 with gate insulation film 17 interposed therebetween. The other configurations are the same with those of the bidirectional super-junction MOSFET according to the eighth embodiment. In FIGS. 24 through 26, the same reference numerals as used in FIGS. 20 and 21 are used to designate the same constituent elements and their duplicated explanations will be omitted. Since the bidirectional super-junction MOSFET according to the tenth embodiment operates in the same manner as the bidirectional super-junction MOSFET according to the eighth embodiment, duplicated explanations on the operations thereof will be also omitted.

The bidirectional super-junction MOSFET according to the tenth embodiment is manufactured in the following way. A resist mask for boron ion implantation is formed on the n-type high resistivity layer of the SOI substrate. Boron ions are implanted into the portions of the n-type high resistivity layer, therein partition regions 2 will be formed. The resist mask for boron ion implantation is removed. An n-type high resistivity layer is deposited epitaxially and a resist mask for phosphorus ion implantation is formed on the n-type epitaxially grown layer. Phosphorus ions are implanted into the portions of the n-type epitaxially grown layer, therein drift regions 1 will be formed. The portions of the n-type high resistivity layers, therein high resistivity regions 3 and 13 will be formed, are covered with the resist masks to prevent the boron ions and the phosphorus ions from being implanted therein.

The step sequence of the epitaxial growth, the boron ion implantation, the epitaxial growth, and the phosphorus ion implantation is repeated until an epitaxial laminate of a predetermined thickness is obtained. Then, drift regions 1 and partition regions 2 are formed by thermally driving and activating the implanted boron atoms and the implanted phosphorus atoms. It is preferable for the uppermost epitaxial layer for forming the alternating conductivity type layer to be of p-type.

The first trench and the second trench are dug by etching in the portions of the epitaxial laminate, therein base regions 4, 14 and high resistivity regions 3 and 13 have been formed. After forming gate insulation film 7 on the side wall of the first trench and gate insulation film 17 on the side wall of the second trench, the trenches are filled with polycrystalline silicon to form gate electrodes 9 and 19. Then, source regions 6 and 16 are formed in respective base regions 4 and 14 so that source regions 6 and 16 may contact with respective gate insulation films 7 and 17. An interlayer insulation film 45 is formed on the semiconductor structure formed so far. Although not shown in FIGS. 24 through 26, source electrodes are formed by sputtering a metal silicide such as Al—Si.

In the same manner as the bidirectional super-junction MOSFET according to the eighth embodiment, the bidirectional super-junction MOSFET according to the tenth embodiment facilitates making a current flow from the first MOSFET to the second MOSFET and vice versa, reducing the on-resistance in the opposite directions and obtaining a high breakdown voltage in the opposite directions. The MOSFET according to the tenth embodiment also facilitates reducing the power consumption of the drive circuit and simplifying the drive circuit due to the employment of the MIS structure.

The devices formed in the device regions are not always limited to MOSFET's. The devices formed in the device regions may include other semiconductor devices such as MIS semiconductor devices having a structure different from the structures described above and bipolar transistors. Although metal wiring is formed above the source electrode of the practical device with an interlayer insulation film interposed therebetween, the metal wiring is not described in the foregoing descriptions and the foregoing drawing figures.

As described above, the bidirectional semiconductor devices according to the invention facilitate making a current flow from the first device region to the second device region and vice versa, reducing the on-voltage in the opposite directions, and maintaining a high breakdown voltage in the opposite directions. Since the alternating conductivity layer is formed easily according to the invention, the manufacturing process is simplified and the manufacturing costs are reduced.

What is claimed is:

1. A bidirectional semiconductor device comprising:
    a first major surface;
    a second major surface;
    an alternating conductivity type layer between the first major surface and the second major surface, the alternating conductivity type layer including drift regions of a first conductivity type and partition regions of a second conductivity type;
    a first MIS-type device region on a first side of the alternating conductivity type layer; and
    a second MIS-type device region on a second side of the alternating conductivity type layer facing opposite to the first side,
    wherein the first MIS-type device region has a third region of the first conductivity type and a plurality of first base regions of the second conductivity type; and
    wherein the second MIS-type device region has a fourth region of the first conductivity type and a plurality of second base regions of the second conductivity type,
    wherein each of the first base regions has a first source region of the first conductivity type,
    wherein each of the second base regions has a second source region of the first conductivity type,
    wherein the third region and the fourth region are connected to each other by the drift regions,
    wherein the third region isolates the first base region from the partition regions,
    wherein the fourth region isolates the second base region from the partition regions,
    wherein the third region and the fourth region include respective sub-regions on the side of the respective corresponding major surfaces, and
    wherein a net impurity concentrations in the respective sub-regions are higher than a net impurity concentration in the drift regions.

2. A bidirectional semiconductor device comprising:
    a first major surface;
    a second major surface;
    a first alternating conductivity type layer and a second alternating conductivity type layer between the first major surface and the second major surface, the first alternating a conductivity type layer including drift regions of a first conductivity type and partition regions of a second conductivity type, the second alternating conductivity type layer including drift regions of the first conductivity type and partition regions of the second conductivity type;
    a first MIS-type device region on a side of the first alternating conductivity type layer;
    a second MIS-type device region on a side of the second alternating conductivity type layer; and
    a semiconductor region of the first conductivity type isolating the partition regions of the first alternating conductivity type layer and the partition regions of the second alternating conductivity type layer from each other,
    wherein the first MIS-type device region has a first base region having a first source region of the first conductivity type,
    wherein the second MIS-type device region has a second base region having a second source region of the first conductivity type, and
    wherein the impurity concentration of the semiconductor region is the same as that of the drift regions.

3. The bidirectional semiconductor device according to claim 2,
    wherein the semiconductor region of the first conductivity type connects the drift regions of the first alternating conductivity type layer and the drift regions of the second alternating conductivity type layer to each other.

4. The bidirectional semiconductor device according to claim 1, wherein the first MIS-type device region and the second MIS-type device region are both located on one of the major surfaces.

5. The bidirectional semiconductor device according to Claim 2, wherein the first MIS-type device region and the second MIS-type device region are both located on one of the major surfaces.

6. The bidirectional semiconductor device according to claim 1, wherein the first MIS-type device region is located on the first major surface and the second MIS-type device region is located on the second major surface.

7. The bidirectional semiconductor device according to claim 2, wherein the first MIS-type device region is located on the first major surface and the second MiS-type device region is located on the second major surface.

8. The bidirectional semiconductor device according to claim 1, wherein a net impurity amount in the drift regions is substantially the same as a net impurity amount in the partition regions.

9. The bidirectional semiconductor device according to claim 1, wherein the boundaries between the drift regions and the partition regions are substantially perpendicular to the first major surface or the second major surface.

10. The bidirectional semiconductor device according to claim 1, wherein the drift regions and the partition regions are shaped in the form of stripes.

11. The bidirectional semiconductor device according to claim 10, wherein the width of the drift regions is substantially the same as the width of the partition regions.

12. The bidirectional semiconductor device according to claim 1, wherein at least one of the drift regions and the partition regions are located at the lattice points of at least one of a trigonal lattice, an orthogonal lattice, and a hexagonal lattice.

13. The bidirectional semiconductor device according to claim 10, wherein the alternating conductivity type layer includes a first alternating conductivity type region and a second alternating conductivity type region; and wherein the boundaries between drift regions and the partition regions in the first alternating conductivity type region are substantially perpendicular to the boundaries between the drift regions and the partition regions in the second alternating conductivity type region.

14. The bidirectional semiconductor device according to claim 1, wherein the net impurity concentration in the third region and the net impurity concentration in the fourth region are lower titan the net impurity concentration in the drift regions.

15. The bidirectional semiconductor device according to claim 1, wherein the bidirectional semiconductor device is a MIS-type semiconductor device including:
the first base regions;
the first source regions of the first conductivity type isolated from the third region by the first base regions;
a first gate electrode above the first base regions and extending between the first source regions and above the third region with a first gate insulation film interposed therebetween;
the second base regions;
the second source regions of the first conductivity type isolated from the fourth region by the second base regions; and
a second gate electrode above the second base regions and extending between the second source regions and above the fourth region with a second gate insulation film interposed therebetween.

16. A bidirectional semiconductor device comprising:
a semiconductor layer on an insulation layer or on a semiconductor substrate;
a first MIS-type device region in a surface portion of the semiconductor layer, the first MIS-type device region having a plurality of first base regions of a second conductivity type, the first base regions each having a first source region of a first conductivity type;
a second MIS-type device region in the surface portion of the semiconductor layer, the second MIS-type device region having a plurality of second base regions of the second conductivity type, the second base regions each having a second source region of the first conductivity type;
a third region of a first conductivity type in the first MIS-type device region;
a fourth region of the first conductivity type in the second MIS-type device region; and
an alternating conductivity type layer between the third region and the fourth region, the alternating conductivity type layer including drift regions of the first conductivity type and partition regions of the second conductivity type arranged alternately,
wherein the third region and the fourth region are connected to each other by the drift regions,
wherein the third region isolates the first base regions from the partition regions; and
wherein the fourth region isolates the second base regions from the partition regions.

17. The bidirectional semiconductor device according to claim 16, wherein a net impurity amount in the drift regions is substantially the same as a net impurity amount in the partition regions.

18. The bidirectional semiconductor device according to claim 17,
wherein the drift regions and the partition regions are rectangular.

19. The bidirectional semiconductor device according to claim 16,
wherein the drift regions and the partition regions are laminated alternately.

20. The bidirectional semiconductor device according to claim 16, wherein the drift regions and the partition regions are shaped in the form of stripes, the widths thereof are substantially the same.

21. The bidirectional semiconductor device according to claim 16,
wherein a net impurity concentration in the third region and the net impurity concentration in the fourth region are lower than a net impurity concentration in the drift regions.

22. The bidirectional semiconductor device according to claim 16,
wherein the bidirectional semiconductor device is a MIS-type semiconductor device including:
the first regions;
a plurality of first source regions of the first conductivity type isolated from the third region by the first regions;
a first gate electrode above an extended portion of the first region which is extended between the first source region and the third region with a first gate insulation film interposed therebetween;
the second regions;
second source regions of the first conductivity type isolated from the fourth region by the second regions; and
a second gate electrode above an extended portion of the second region which is extended between the second source region and the fourth region with a second gate insulation film interposed therebetween.

23. The bidirectional semiconductor device according to claim 16,
wherein the drift regions and the partition regions are shaped in the form of stripes.

24. The bidirectional semiconductor device according to claim 16,
wherein the bidirectional semiconductor device is a MIS-type semiconductor device including:
a first trench in a portion of the third region;
a first insulation film on an inner wall of the first trench, the first insulation film contacting with the first regions;
a plurality of first source regions of the first conductivity type contacting with the first insulation film, the first source regions being isolated from the third region by the first regions;
a second trench in a portion of the fourth region;
a second insulation film on an inner wall of the second trench, the second insulation film contacting with the second regions; and
a plurality of second source regions of the first conductivity type contacting with the second insulation film, the second source regions being isolated from the fourth region by the second regions.

25. A method of manufacturing a bidirectional semiconductor device formed of a first half device having a first device region and a first alternating conductivity type layer separated from the first device region and a second half device having a second device region and a second alternating conductivity type layer separated from the second device region, comprising the steps of:

forming the first half device including the first device region and the first alternating conductivity type layer, which is formed of drift regions of a first conductivity type and partition regions of a second conductivity type, the first alternating conductivity type layer forming a back side of the first half device;

forming the second half device including the second device region and the second alternating conductivity type layer, which is formed of drift regions of the first conductivity type and partition regions of the second conductivity type, the second alternating conductivity type layer forming a back side of the second half device; and bonding the back surface of the first half device to the back surface of the second half device.

26. The bidirectional semiconductor device according to claim 1, wherein the net impurity concentration in the third region and the net impurity concentration in the fourth region are lower than the net impurity concentration in the drift regions.

* * * * *